United States Patent
Leipold et al.

(10) Patent No.: US 11,139,238 B2
(45) Date of Patent: Oct. 5, 2021

(54) HIGH Q FACTOR INDUCTOR STRUCTURE

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US); Toshiaki Moriuchi, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 371 days.

(21) Appl. No.: 15/835,041

(22) Filed: Dec. 7, 2017

(65) Prior Publication Data

US 2018/0158775 A1    Jun. 7, 2018

Related U.S. Application Data

(60) Provisional application No. 62/431,137, filed on Dec. 7, 2016.

(51) Int. Cl.
| H01F 5/00 | (2006.01) |
| H01L 23/522 | (2006.01) |
| H01F 41/04 | (2006.01) |
| H01F 17/00 | (2006.01) |
| H01L 49/02 | (2006.01) |

(52) U.S. Cl.
CPC ......... *H01L 23/5227* (2013.01); *H01F 5/003* (2013.01); *H01F 17/0013* (2013.01); *H01F 41/041* (2013.01); *H01L 28/10* (2013.01); *H01F 2017/002* (2013.01); *H01F 2017/0073* (2013.01)

(58) Field of Classification Search
USPC .................. 336/200, 223, 192, 186, 232, 83
See application file for complete search history.

(56) References Cited

U.S. PATENT DOCUMENTS

| | | |
|---|---|---|
| 2,014,524 A | 9/1935 | Franz |
| 2,874,360 A | 2/1959 | Eisler |
| 3,465,431 A | 9/1969 | Henning |
| 3,491,318 A | 1/1970 | Henning et al. |
| 3,597,709 A | 8/1971 | Rhodes |
| 3,718,874 A | 2/1973 | Cooper, Jr. |
| 3,794,941 A | 2/1974 | Templin |

(Continued)

FOREIGN PATENT DOCUMENTS

| | | |
|---|---|---|
| EP | 0957368 A2 | 11/1999 |
| EP | 1184977 A2 | 3/2002 |

(Continued)

OTHER PUBLICATIONS

Final Office Action for U.S. Appl. No. 15/961,299, dated Mar. 5, 2019, 11 pages.

(Continued)

*Primary Examiner* — Shawki S Ismail
*Assistant Examiner* — Kazi S Hossain
(74) *Attorney, Agent, or Firm* — Withrow & Terranova, PLLC

(57) ABSTRACT

A three-dimensional (3-D) inductor is incorporated in a substrate. The 3-D inductor has a first connector plate, a second connector plate, a third connector plate, a first terminal plate, and a second terminal plate. Four multi-via walls connect the various plates, wherein each multi-via wall includes a first group of at least three individual via columns, each of which connects two plates together.

26 Claims, 17 Drawing Sheets

(56) References Cited

U.S. PATENT DOCUMENTS

| | | |
|---|---|---|
| 4,169,252 A | 9/1979 | Muszkiewicz |
| 4,296,440 A | 10/1981 | Rosenheck |
| 4,361,894 A | 11/1982 | Kurihara et al. |
| 4,484,345 A | 11/1984 | Stearns |
| 4,816,784 A | 3/1989 | Rabjohn |
| 4,894,566 A | 1/1990 | Rush |
| 5,296,831 A | 3/1994 | Suzuki |
| 5,339,017 A | 8/1994 | Yang |
| 5,517,083 A | 5/1996 | Whitlock |
| 5,608,363 A | 3/1997 | Cameron et al. |
| 5,661,414 A | 8/1997 | Shigehara et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,150,901 A | 11/2000 | Auken |
| 6,215,374 B1 | 4/2001 | Petrovic |
| 6,233,438 B1 | 5/2001 | Wynn |
| 6,239,673 B1 | 5/2001 | Wenzel et al. |
| 6,362,986 B1 * | 3/2002 | Schultz ............... H02M 3/158 363/132 |
| 6,522,217 B1 | 2/2003 | Shen |
| 6,529,750 B1 | 3/2003 | Zhang et al. |
| 6,664,873 B2 | 12/2003 | Tiihonen |
| 6,801,102 B2 | 10/2004 | Shamsaifar et al. |
| 6,806,793 B2 * | 10/2004 | Bhatia ............... H01L 23/15 257/E23.009 |
| 6,809,421 B1 | 10/2004 | Hayasaka et al. |
| 7,015,870 B2 | 3/2006 | Guitton et al. |
| 7,116,186 B2 | 10/2006 | Chen |
| 7,164,339 B2 | 1/2007 | Huang |
| 7,253,712 B1 | 8/2007 | Papananos |
| 7,262,680 B2 | 8/2007 | Wang |
| 7,336,939 B2 | 2/2008 | Gomez |
| 7,378,733 B1 | 5/2008 | Hoang et al. |
| 7,570,129 B2 | 8/2009 | Kintis et al. |
| 7,573,350 B2 | 8/2009 | Frank |
| 7,733,207 B2 | 6/2010 | Yun et al. |
| 7,741,943 B2 | 6/2010 | Fouquet et al. |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 7,852,186 B2 | 12/2010 | Fouquet et al. |
| 7,973,633 B2 | 7/2011 | Noma et al. |
| 8,103,233 B2 | 1/2012 | Im et al. |
| 8,193,781 B2 | 6/2012 | Lin et al. |
| 8,204,446 B2 | 6/2012 | Scheer et al. |
| 8,258,911 B2 | 9/2012 | Fouquet |
| 8,269,575 B2 | 9/2012 | Frye et al. |
| 8,314,653 B1 | 11/2012 | Granger-Jones et al. |
| 8,346,179 B2 | 1/2013 | Brunn et al. |
| 8,362,751 B2 | 1/2013 | Lin et al. |
| 8,369,250 B1 | 2/2013 | Khlat |
| 8,400,232 B2 | 3/2013 | Leong et al. |
| 8,626,083 B2 | 1/2014 | Greene et al. |
| 8,736,511 B2 | 5/2014 | Morris, III |
| 8,742,871 B2 | 6/2014 | Jin et al. |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,841,983 B2 | 9/2014 | Newton et al. |
| 8,862,089 B2 | 10/2014 | Wang et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,048,112 B2 | 6/2015 | Pan et al. |
| 9,054,648 B1 | 6/2015 | Xu |
| 9,094,104 B2 | 7/2015 | Din et al. |
| 9,124,355 B2 | 9/2015 | Black et al. |
| 9,196,406 B2 | 11/2015 | Leipold et al. |
| 9,203,455 B2 | 12/2015 | Yang et al. |
| 9,312,060 B2 | 4/2016 | Godoy et al. |
| 9,369,162 B2 | 6/2016 | Lo et al. |
| 9,385,055 B2 | 7/2016 | Refai-Ahmed et al. |
| 9,391,650 B2 | 7/2016 | Aparin |
| 9,444,417 B2 | 9/2016 | Maxim et al. |
| 9,472,332 B2 | 10/2016 | Nakamura et al. |
| 9,608,595 B1 | 3/2017 | Raihn et al. |
| 9,628,045 B2 | 4/2017 | Leipold et al. |
| 9,698,751 B2 | 7/2017 | Leipold et al. |
| 9,721,903 B2 | 8/2017 | Lee et al. |
| 2001/0020877 A1 | 9/2001 | Hasegawa et al. |
| 2002/0057139 A1 | 5/2002 | Matsumura et al. |
| 2002/0095778 A1 | 7/2002 | Ahn et al. |
| 2003/0008577 A1 | 1/2003 | Quigley et al. |
| 2003/0008628 A1 | 1/2003 | Lindell et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0182602 A1 | 9/2004 | Satoh et al. |
| 2004/0196085 A1 | 10/2004 | Shen |
| 2004/0222868 A1 | 11/2004 | Rathgeber et al. |
| 2004/0227578 A1 | 11/2004 | Hamalainen |
| 2004/0266378 A1 | 12/2004 | Fukamachi et al. |
| 2005/0150106 A1 | 7/2005 | Long et al. |
| 2005/0190035 A1 | 9/2005 | Wang |
| 2005/0195063 A1 | 9/2005 | Mattsson |
| 2005/0237144 A1 | 10/2005 | Einzinger et al. |
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0055050 A1 | 3/2006 | Numata et al. |
| 2006/0058629 A1 | 3/2006 | Warntjes et al. |
| 2006/0109064 A1 | 5/2006 | Toncich et al. |
| 2006/0125465 A1 | 6/2006 | Xiang et al. |
| 2006/0145804 A1 | 7/2006 | Matsutani et al. |
| 2006/0176135 A1 | 8/2006 | Winter et al. |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0085648 A1 | 4/2007 | Lee et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0002380 A1 | 1/2008 | Hazucha et al. |
| 2008/0096516 A1 | 4/2008 | Mun et al. |
| 2008/0099884 A1 | 5/2008 | Inohara |
| 2008/0122560 A1 | 5/2008 | Liu |
| 2008/0164967 A1 | 7/2008 | Mashino |
| 2008/0197963 A1 | 8/2008 | Muto |
| 2008/0220735 A1 | 9/2008 | Kim et al. |
| 2008/0297299 A1 | 12/2008 | Yun et al. |
| 2008/0303623 A1 | 12/2008 | Hsu et al. |
| 2009/0058589 A1 | 3/2009 | Chen et al. |
| 2009/0088110 A1 | 4/2009 | Schuur et al. |
| 2009/0134947 A1 | 5/2009 | Tarng |
| 2009/0134953 A1 | 5/2009 | Hunt et al. |
| 2009/0167460 A1 | 7/2009 | Akasegawa et al. |
| 2009/0261936 A1 | 10/2009 | Widjaja et al. |
| 2009/0289721 A1 | 11/2009 | Rajendran et al. |
| 2010/0060354 A1 | 3/2010 | Maeda |
| 2010/0144305 A1 | 6/2010 | Cook et al. |
| 2010/0148344 A1 | 6/2010 | Chandra et al. |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0050384 A1 | 3/2011 | Chen et al. |
| 2011/0103494 A1 | 5/2011 | Ahmadi |
| 2011/0156835 A1 | 6/2011 | Nagai |
| 2011/0159834 A1 | 6/2011 | Salvi |
| 2011/0163824 A1 | 7/2011 | Kawano |
| 2011/0169589 A1 | 7/2011 | Franzon et al. |
| 2011/0210787 A1 | 9/2011 | Lee et al. |

(56) References Cited

U.S. PATENT DOCUMENTS

| | | |
|---|---|---|
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0139090 A1 | 6/2012 | Kim et al. |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0268229 A1 | 10/2012 | Yen et al. |
| 2012/0280366 A1 | 11/2012 | Kamgaing et al. |
| 2012/0286900 A1 | 11/2012 | Kadota et al. |
| 2013/0049902 A1 | 2/2013 | Hendry et al. |
| 2013/0143381 A1 | 6/2013 | Kikukawa |
| 2013/0168810 A1* | 7/2013 | Cho .................. H01L 23/5225 257/531 |
| 2013/0176013 A1 | 7/2013 | Takemae et al. |
| 2013/0221526 A1 | 8/2013 | Lange et al. |
| 2013/0244591 A1 | 9/2013 | Weissman et al. |
| 2013/0257564 A1 | 10/2013 | Huang et al. |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |
| 2014/0167877 A1 | 6/2014 | Shimizu et al. |
| 2014/0167896 A1 | 6/2014 | Tung et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0266531 A1 | 9/2014 | Leipold et al. |
| 2014/0266544 A1 | 9/2014 | Leipold et al. |
| 2014/0285286 A1 | 9/2014 | Bojer |
| 2014/0323046 A1 | 10/2014 | Asai et al. |
| 2014/0323071 A1 | 10/2014 | Liao |
| 2014/0328220 A1 | 11/2014 | Khlat et al. |
| 2014/0361848 A1 | 12/2014 | Leipold et al. |
| 2014/0361849 A1 | 12/2014 | Maxim et al. |
| 2014/0361852 A1 | 12/2014 | Leipold et al. |
| 2014/0364077 A1 | 12/2014 | Maxim et al. |
| 2015/0001708 A1 | 1/2015 | Lin |
| 2015/0002240 A1 | 1/2015 | Reiha |
| 2015/0035612 A1 | 2/2015 | Maxim et al. |
| 2015/0035617 A1 | 2/2015 | Leipold et al. |
| 2015/0035622 A1 | 2/2015 | Maxim et al. |
| 2015/0035637 A1* | 2/2015 | Maxim .................. H03F 3/68 336/192 |
| 2015/0038094 A1 | 2/2015 | Maxim et al. |
| 2015/0038101 A1 | 2/2015 | Maxim et al. |
| 2015/0042399 A1 | 2/2015 | Imbornone et al. |
| 2015/0056939 A1 | 2/2015 | Ong et al. |
| 2015/0061680 A1 | 3/2015 | Leskowitz |
| 2015/0065070 A1 | 3/2015 | Maxim et al. |
| 2015/0084699 A1 | 3/2015 | Maxim et al. |
| 2015/0084713 A1 | 3/2015 | Maxim et al. |
| 2015/0084718 A1 | 3/2015 | Maxim et al. |
| 2015/0092625 A1 | 4/2015 | Leipold et al. |
| 2015/0094008 A1 | 4/2015 | Maxim et al. |
| 2015/0102887 A1 | 4/2015 | Park |
| 2015/0116950 A1 | 4/2015 | Yoo et al. |
| 2015/0117280 A1 | 4/2015 | Khlat et al. |
| 2015/0117281 A1 | 4/2015 | Khlat et al. |
| 2015/0226950 A1 | 8/2015 | Booth et al. |
| 2016/0126613 A1 | 5/2016 | Leipold et al. |
| 2016/0126623 A1 | 5/2016 | Maxim et al. |
| 2016/0359510 A1 | 12/2016 | Scott et al. |
| 2016/0359511 A1 | 12/2016 | Maxim et al. |
| 2017/0062119 A1 | 3/2017 | Zybura et al. |
| 2017/0084991 A1 | 3/2017 | Mayo |
| 2017/0134058 A1 | 5/2017 | Leipold et al. |

FOREIGN PATENT DOCUMENTS

| | | |
|---|---|---|
| JP | 06082539 A | 3/1994 |
| JP | 07015253 A | 1/1995 |
| JP | 2010141827 A | 6/2010 |
| KR | 100812098 B1 | 3/2008 |
| KR | 20110114238 A | 10/2011 |
| WO | 0146971 A1 | 6/2001 |
| WO | 2005117255 A1 | 12/2005 |

OTHER PUBLICATIONS

Non-Final Office Action for U.S. Appl. No. 15/717,525, dated Mar. 4, 2019, 10 pages.

Notice of Allowance for U.S. Appl. No. 15/972,917, dated Jan. 28, 2019, 7 pages.

Final Office Action for U.S. Appl. No. 15/208,780, dated Mar. 7, 2019, 9 pages.

Non-Final Office Action for U.S. Appl. No. 15/961,299, dated Jun. 25, 2019, 11 pages.

Notice of Allowance and Examiner-Initiated Interview Summary for U.S. Appl. No. 15/717,525, dated Jun. 26, 2019, 10 pages.

Non-Final Office Action for U.S. Appl. No. 15/208,780, dated Aug. 7, 2019, 11 pages.

Hoppenjans, Eric E. et al., "A Vertically Integrated Tunable UHF Filter," International Microwave Symposium Digest (MTT), May 23-28, 2010, Anaheim, California, IEEE, pp. 1380-1383.

Joshi, H. et al., "Tunable high Q narrow-band triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, dated Jun. 20, 2014, 14 pages.

International Preliminary Report on Patentability for PCT/US/2014/030431, dated Sep. 24, 2015, 10 pages.

Non-Final Office Action for U.S. Appl. No. 14/215,800, dated Nov. 20, 2015, 5 pages.

Final Office Action for U.S. Appl. No. 14/215,800, dated Mar. 11, 2016, 6 pages.

Non-Final Office Action for U.S. Appl. No. 14/215,800, dated Aug. 11, 2016, 6 pages.

Invitation to Pay Additional Fees and, Where Applicable, Protest Fee for PCT/US2014/048608, dated Oct. 21, 2014, 7 pages.

International Search Report and Written Opinion for PCT/US2014/048608, dated Dec. 16, 2014, 18 pages.

International Preliminary Report on Patentability for PCT/US2014/048608, dated Feb. 11, 2016, 14 pages.

Non-Final Office Action for U.S. Appl. No. 14/298,829, dated Jun. 22, 2015, 8 pages.

Final Office Action for U.S. Appl. No. 14/298,829, dated Feb. 3, 2016, 10 pages.

Notice of Allowance for U.S. Appl. No. 14/298,829, dated May 20, 2016, 9 pages.

Non-Final Office Action for U.S. Appl. No. 14/298,830, dated Dec. 3, 2015, 10 pages.

Notice of Allowance for U.S. Appl. No. 14/298,830, dated Apr. 7, 2016, 9 pages.

Non-Final Office Action for U.S. Appl. No. 14/298,863, dated Jan. 7, 2016, 16 pages.

Final Office Action for U.S. Appl. No. 14/298,863, dated Jun. 3, 2016, 17 pages.

Non-Final Office Action for U.S. Appl. No. 14/449,913, dated Mar. 28, 2016, 15 pages.

Final Office Action for U.S. Appl. No. 14/449,913, dated Sep. 7, 2016, 14 pages.

Non-Final Office Action for U.S. Appl. No. 14/298,852, dated Dec. 22, 2015, 7 pages.

Notice of Allowance for U.S. Appl. No. 14/298,852, dated May 13, 2016, 9 pages.

(56) References Cited

OTHER PUBLICATIONS

Notice of Allowance for U.S. Appl. No. 14/298,852, dated Jul. 13, 2016, 9 pages.
Non-Final Office Action for U.S. Appl. No. 14/450,156, dated Mar. 14, 2016, 11 pages.
Non-Final Office Action for U.S. Appl. No. 14/450,156, dated Sep. 15, 2016, 11 pages.
Non-Final Office Action for U.S. Appl. No. 14/450,028, dated Dec. 10, 2015, 11 pages.
Final Office Action for U.S. Appl. No. 14/450,028, dated Mar. 31, 2016, 12 pages.
Advisory Action for U.S. Appl. No. 14/450,028, dated Aug. 2, 2016, 3 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Notice of Allowance for U.S. Appl. No. 14/450,199, dated Aug. 1, 2016, 7 pages.
Non-Final Office Action for U.S. Appl. No. 14/450,204, dated Apr. 22, 2016, 8 pages.
Non-Final Office Action for U.S. Appl. No. 14/555,053, dated Dec. 31, 2015, 5 pages.
Notice of Allowance for U.S. Appl. No. 14/555,053, dated Apr. 19, 2016, 7 pages.
Non-Final Office Action for U.S. Appl. No. 14/450,200, dated Feb. 29, 2016, 13 pages.
Final Office Action for U.S. Appl. No. 14/450,200, dated Jun. 14, 2016, 13 pages.
Non-Final Office Action for U.S. Appl. No. 14/450,200, dated Sep. 8, 2016, 14 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Non-Final Office Action for U.S. Appl. No. 14/298,863, dated Sep. 26, 2016, 9 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.
Notice of Allowance for U.S. Appl. No. 15/223,416, dated Dec. 2, 2016, 8 pages.
Final Office Action for U.S. Appl. No. 14/215,800, dated Feb. 8, 2017, 7 pages.
Final Office Action for U.S. Appl. No. 14/298,863, dated Feb. 14, 2017, 10 pages.
Final Office Action for U.S. Appl. No. 14/450,028, dated Jan. 19, 2017, 12 pages.
Non-Final Office Action for U.S. Appl. No. 15/961,299, dated Sep. 5, 2018, 10 pages.
Non-Final Office Action for U.S. Appl. No. 15/208,780, dated Oct. 22, 2018, 7 pages.
Non-Final Office Action for U.S. Appl. No. 14/450,204, dated Feb. 1, 2017, 9 pages.
Notice of Allowance and Examiner-Initiated Interview Summary for U.S. Appl. No. 14/450,200, dated Feb. 10, 2017, 8 pages.
Non-Final Office Action for U.S. Appl. No. 14/555,557, dated Feb. 13, 2017, 21 pages.
Non-Final Office Action for U.S. Appl. No. 14/554,975, dated Feb. 16, 2017, 9 pages.
Notice of Allowance for U.S. Appl. No. 15/223,416, dated Feb. 28, 2017, 8 pages.
Non-Final Office Action for U.S. Appl. No. 15/240,420, dated Jan. 26, 2017, 7 pages.
Non-Final Office Action for U.S. Appl. No. 15/241,823, dated Jan. 17, 2017, 6 pages.
Final Office Action for U.S. Appl. No. 14/449,764, dated Mar. 2, 2017, 10 pages.
Corrected Notice of Allowability for U.S. Appl. No. 14/450,200, dated Mar. 1, 2017, 3 pages.
Advisory Action for U.S. Appl. No. 14/215,800, dated Apr. 20, 2017, 2 pages.
Notice of Allowance for U.S. Appl. No. 14/298,863, dated May 31, 2017, 6 pages.
Final Office Action for U.S. Appl. No. 14/450,156, dated Apr. 27, 2017, 12 pages.
Notice of Allowance for U.S. Appl. No. 14/450,028, dated May 3, 2017, 5 pages.
Notice of Allowance and Examiner-Initiated Interview Summary for U.S. Appl. No. 14/449,764, dated May 19, 2017, 8 pages.
Notice of Allowance for U.S. Appl. No. 14/450,204, dated Jun. 28, 2017, 8 pages.
Notice of Allowance for U.S. Appl. No. 14/555,371, dated Mar. 31, 2017, 8 pages.
Notice of Allowance and Examiner-Initiated Inteview Summary for U.S. Appl. No. 14/554,975, dated Jul. 17, 2017, 9 pages.
Notice of Allowance for U.S. Appl. No. 15/240,420, dated May 10, 2017, 8 pages.
Notice of Allowance for U.S. Appl. No. 15/241,823, dated May 9, 2017, 7 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.
Non-Final Office Action for U.S. Appl. No. 14/215,800, dated Aug. 15, 2017, 6 pages.
Notice of Allowance for U.S. Appl. No. 14/450,156, dated Oct. 11, 2017, 10 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Advisory Action for U.S. Appl. No. 14/555,557, dated Nov. 3, 2017, 3 pages.
Final Office Action for U.S. Appl. No. 14/555,557, dated Aug. 7, 2017, 21 pages.
Duplessis, M., et al., "Physical implementation of 3D integrated solenoids within silicon substrate for hybrid IC applications," presented at the European Microwave Conference, Sep. 29-Oct. 1, 2009, Rome, IEEE, pp. 1006-1009.
Invitation to Pay Additional Fees for PCT/US2014/030188, dated Jul. 4, 2014, 8 pages.
International Search Report and Written Opinion for PCT/US2014/030188, dated Sep. 5, 2014, 19 pages.
International Preliminary Report on Patentability for PCT/US2014/030188, dated Sep. 24, 2015, 13 pages.
Non-Final Office Action for U.S. Appl. No. 14/099,007, dated Oct. 30, 2014, 10 pages.
Final Office Action for U.S. Appl. No. 14/099,007, dated Mar. 4, 2015, 14 pages.
Notice of Allowance for U.S. Appl. No. 14/099,007, dated Jul. 22, 2015, 9 pages.
Non-Final Office Action for U.S. Appl. No. 14/450,156, dated Sep. 9, 2015, 13 pages.
Notice of Allowance for U.S. Appl. No. 14/215,800, dated Jan. 9, 2018, 8 pages.
Notice of Allowance for U.S. Appl. No. 15/587,581, dated Dec. 8, 2017, 7 pages.
Non-Final Office Action for U.S. Appl. No. 15/961,299, dated May 1, 2020, 12 pages.
Notice of Allowance for U.S. Appl. No. 15/208,780, dated May 27, 2020, 9 pages.

(56) References Cited

OTHER PUBLICATIONS

Non-Final Office Action for U.S. Appl. No. 16/402,336, dated Oct. 6, 2020, 7 pages.
Notice of Allowance for U.S. Appl. No. 15/961,299, dated Nov. 17, 2020, 7 pages.
Final Office Action for U.S. Appl. No. 16/402,336, dated Apr. 1, 2021, 7 pages.
Non-Final Office Action for U.S. Appl. No. 16/590,449, dated Mar. 30, 2021, 13 pages.
Final Office Action for U.S. Appl. No. 15/961,299, dated Dec. 31, 2019, 13 pages.
Final Office Action for U.S. Appl. No. 15/208,780, dated Jan. 8, 2020, 12 pages.
Advisory Action for U.S. Appl. No. 15/208,780, dated Mar. 13, 2020, 3 pages.
Notice of Allowance for U.S. Appl. No. 16/590,449, dated Jul. 16, 2021, 8 pages.

* cited by examiner

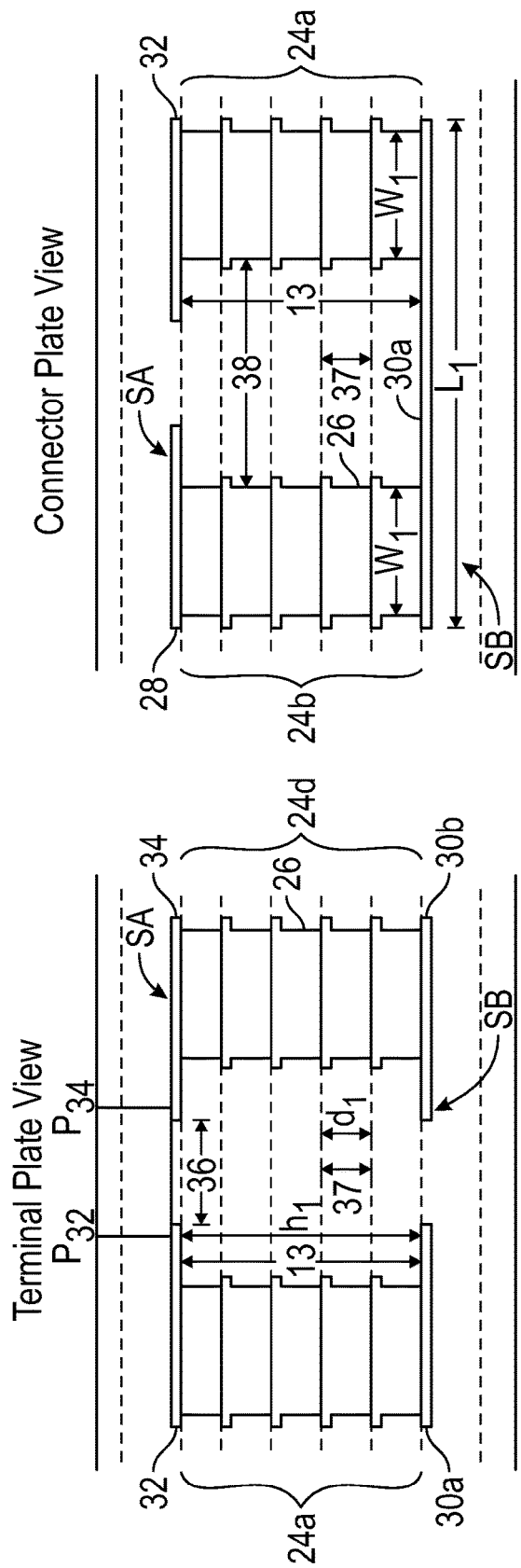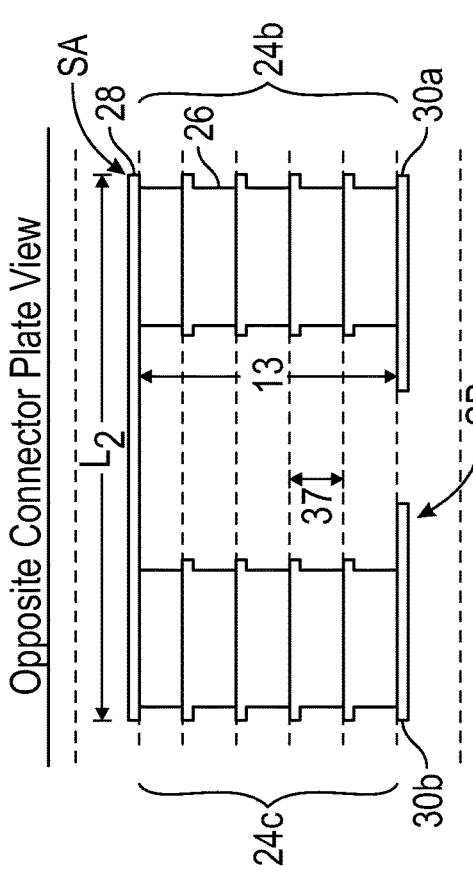

HIGH Q FACTOR INDUCTOR STRUCTURE

RELATED APPLICATIONS

This application claims the benefit of U.S. Provisional Patent Application Ser. No. 62/431,137, filed Dec. 7, 2016, the disclosure of which is incorporated herein by reference in its entirety.

This application is related to U.S. patent application Ser. No. 14/099,007, filed Dec. 6, 2013 and issued as U.S. Pat. No. 9,196,406, which claims the benefit of U.S. Provisional Patent Application Ser. No. 61/789,693, filed Mar. 15, 2013; U.S. Provisional Patent Application Ser. No. 61/831,666, filed Jun. 6, 2013; U.S. Provisional Patent Application Ser. No. 61/860,932, filed Aug. 1, 2013; and U.S. Provisional Patent Application Ser. No. 61/909,028, filed Nov. 26, 2013, the disclosures of which are incorporated herein by reference in their entireties.

This application is related to U.S. patent application Ser. No. 14/450,156, filed Aug. 1, 2014 and issued as U.S. Pat. No. 9,899,133, which claims the benefit of U.S. Provisional Patent Application No. 61/860,932, filed Aug. 1, 2013; U.S. Provisional Patent Application No. 61/909,028, filed Nov. 26, 2013; U.S. Provisional Patent Application No. 61/938,884, filed Feb. 12, 2014; U.S. Provisional Patent Application No. 61/949,581, filed Mar. 7, 2014; U.S. Provisional Patent Application No. 61/951,844, filed Mar. 12, 2014; U.S. Provisional Patent Application No. 61/982,946, filed Apr. 23, 2014; U.S. Provisional Patent Application No. 61/982,952, filed Apr. 23, 2014; U.S. Provisional Patent Application No. 61/982,971, filed Apr. 23, 2014; U.S. Provisional Patent Application No. 62/008,192, filed Jun. 5, 2014; and U.S. Provisional Patent Application No. 62/031,645, filed Jul. 31, 2014, the disclosures of which are incorporated herein by reference in their entireties.

U.S. Pat. No. 9,899,133 is further a continuation-in-part of U.S. patent application Ser. No. 14/298,829, filed Jun. 6, 2014 and issued as U.S. Pat. No. 9,455,680; U.S. patent application Ser. No. 14/298,830, filed Jun. 6, 2014 and issued as U.S. Pat. No. 9,419,578; U.S. patent application Ser. No. 14/298,834, filed Jun. 6, 2014 and issued as U.S. Pat. No. 9,893,710; U.S. patent application Ser. No. 14/298,872, filed Jun. 6, 2014 and issued as U.S. Pat. No. 9,484,879; U.S. patent application Ser. No. 14/298,863, filed Jun. 6, 2014 and issued as U.S. Pat. No. 9,866,197; and U.S. patent application Ser. No. 14/298,852, filed Jun. 6, 2014 and issued as U.S. Pat. No. 9,614,490, the disclosures of which are incorporated herein by reference in their entireties.

U.S. Pat. No. 9,899,133 is further a Continuation-in-Part of U.S. patent application Ser. No. 14/099,007, filed Dec. 6, 2013 and issued as U.S. Pat. No. 9,196,406; which claims priority to U.S. Provisional Patent Application No. 61/789,693, filed Mar. 15, 2013, the disclosures of which are incorporated herein by reference in their entireties.

The present application is further related to U.S. patent application Ser. No. 14/450,156, filed Aug. 1, 2014 and issued as U.S. Pat. No. 9,899,133; and U.S. patent application Ser. No. 15/717,525, filed Sep. 27, 2017 and issued as U.S. Pat. No. 10,468,172, the disclosures of which are incorporated herein by reference in their entireties.

FIELD OF THE DISCLOSURE

The present disclosure is directed to an inductor structure. More specifically, the present disclosure relates to an inductor structure having a high quality (Q) factor.

BACKGROUND

Consumers are demanding increasingly sophisticated functionality from their mobile devices. For instance, the ability to have a video chat over a wireless network on a mobile phone is a sophisticated and complicated type of service mobile phones are expected to offer. The demand for increased functionality increases the complexity of the underlying circuitry of a mobile device and decreases the amount of space on the circuit board for various types of circuitry of the mobile device. One of the most complex and space-consuming types of circuitry is the signal processing circuitry. In particular, resonant circuits within the signal processing circuitry possess inductors, which are typically difficult to miniaturize or condense into smaller areas of a mobile device circuit board.

The difficulty in miniaturizing or condensing inductors is due to design limitations in achieving a high quality (Q) factor and a small coupling factor. The Q factor of an inductor is the ratio of the inductor's inductive reactance to its resistance at a given frequency, and is a measure of the inductor's efficiency. High internal resistances lower the Q factor of an inductor.

Inductor Q factors are commonly the limiting design factor for the insertion loss of passive filters and impedance matching circuits that are commonly found in front end modules, antenna tuners, tunable band pass filters, duplexers, and similar resonant circuits. Inductors used in these applications need to provide good isolation to avoid signal leakage. Isolation between current planar inductors is limited by a coupling factor resulting from the magnetic field generated across the design plane, as shown in FIG. 1. The magnetic field is open outside of an inductor 10, and without any field cancellation, the inductor 10 picks up the magnetic field of an inductor 12, and vice versa, increasing the coupling factor between the inductors 10 and 12.

One known method of solving the isolation design limitations presented in FIG. 1 is to simply widen the distance between the inductor 10 and the inductor 12 so the inductors 10 and 12 do not pick up each other's magnetic fields. This solution is not viable in resonant circuitry on mobile device circuit boards as the circuit board space is simply not available.

Another known method of solving the isolation problem shown in FIG. 1 is to "fold" the circular inductors 10 and 12 into a folded figure eight design. The coupling factor between the inductors 10 and 12 is reduced or improved, but the magnetic field still runs across the design plane, such that significant spacing is still needed between the inductors 10 and 12 and underpass circuitry connected to this known solution can be complex.

Still another known method of solving the isolation design limitations shown in FIG. 1 is to create a vertical coil inductor within a multi-layered substrate, such as a laminate, utilizing standard tube vias. Placing the coil inductor vertically within the multi-layered substrate, instead of horizontally as shown in FIG. 1, enables the magnetic field to run parallel to the design plane, reducing the coupling factor of the inductor. However, standard tube vias limit inductor performance. When placing multiple tube vias in parallel, to create a coil, the required spacing between standard tube vias limits the metal density of the inductor, limiting the Q factor. Also, the magnetic field of the inductor will cause the current to be restricted to a very small effective area of the standard tube vias, further limiting the Q factor.

Thus, there is need for a high Q factor 3-D inductor with a small, or substantially zero, coupling factor that does not take up a significant amount of space on a circuit board of a mobile device.

SUMMARY

The present disclosure relates to incorporating a unique three-dimensional (3-D) inductor in a substrate. The 3-D inductor has a first connector plate, a second connector plate, a third connector plate, a first terminal plate, and a second terminal plate. A first multi-via wall includes a first group of at least three individual via columns, each of which connects the first terminal plate to the first connector plate. A second multi-via wall includes a second group of at least three via columns, each of which connects the second terminal plate to the second connector plate. A third multi-via wall includes a third group of at least three individual via columns, each of which connects the first connector plate to the third connector plate. A fourth multi-via wall includes a fourth group of at least three individual via columns that connect the second connector plate to the third connector plate. The first connector plate and the second connector plate are adjacent one another, and a metal band is defined at least in part by the first multi-via wall, the first connector plate, the third multi-via wall, the third connector plate, the fourth multi-via wall, the second connector plate, and the second multi-via wall.

In one embodiment, the first connector plate and second connector plate are in parallel with one another and perpendicular to the third connector plate.

In one embodiment, the at least three via columns for each of the first, second, third, and fourth multi-via walls are formed from a plurality of vias that are stacked on top of one another.

In one embodiment, the at least three via columns for each of the first, second, third, and fourth multi-via walls are linear and formed from a plurality of vias that are stacked on top of one another.

In one embodiment, at least one of the at least three via columns for each of the first, second, third, and fourth multi-via walls is linear and formed from a plurality of vias that are stacked on top of one another.

In one embodiment, at least one of the at least three via columns for each of the first, second, third, and fourth multi-via walls is non-linear and formed from a plurality of vias that are stacked on top of one another.

In one embodiment, a value of the high Q factor is greater or equal to 100 and can extend to 1000 or greater.

In one embodiment, the first connector plate, the first multi-via wall, the first connector plate, the third multi-via wall, the third connector plate, the fourth multi-via wall, the second connector plate, the second multi-via wall, and the second connector plate are connected to form a three dimensional structure, such as spherical structure, polygonal structure, or the like having an interior, wherein a magnetic field caused by current flowing along the metal band is substantially confined to the interior.

In one embodiment, the substrate has a plurality of substrate layers, and the at least three via columns for each of the first, second, third, and fourth multi-via walls are formed from a plurality of vias that are stacked on top of one another and each of the plurality of vias resides in a different layer of the plurality of substrate layers.

In one embodiment, the 3-D inductor has a top face and an opposing bottom face defined by an outer periphery of the first connector plate, the first multi-via wall, the first connector plate, the third multi-via wall, the third connector plate, the fourth multi-via wall, the second connector plate, the second multi-via wall, and the second connector plate, wherein the top face and the bottom face define a polygon, such as equilateral polygon.

In one embodiment, the first multi-via wall is parallel with and opposes the fourth multi-via wall, and the second multi-via wall is parallel with and opposes the third multi-via wall.

In one embodiment, the first, second, third, and fourth multi-via walls are of a substantially equal width, and the first, second, third, and fourth multi-via walls are spaced apart from one another a distance that is substantially equal to the width.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A illustrates a cross-section terminal view of the terminal side of the first embodiment in a multi-layered substrate;

FIG. 4B illustrates a cross-section side view of the first embodiment in the multi-layered substrate;

FIG. 4C illustrates a cross-section terminal view opposite of the terminal side of the first embodiment in the multi-layered substrate;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure provides a 3-D inductor with a high quality (Q) factor, a magnetic field of the 3-D inductor closed to an interior of the 3-D inductor, and a coupling factor that is small, or substantially zero. The 3-D inductors of the present disclosure significantly reduce the amount of space taken up by resonant circuitry on a circuit board of a mobile device. However, the present disclosure is not limited to such environments and can be used in any environment in which an inductor is used.

Figure 1:
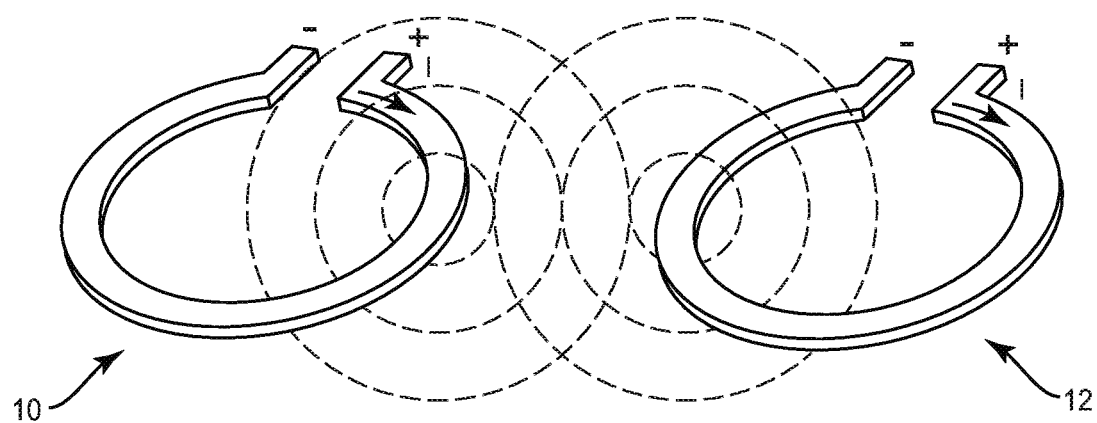
FIG. 1 illustrates conventional planar loop inductors from related art.
Figure 2:
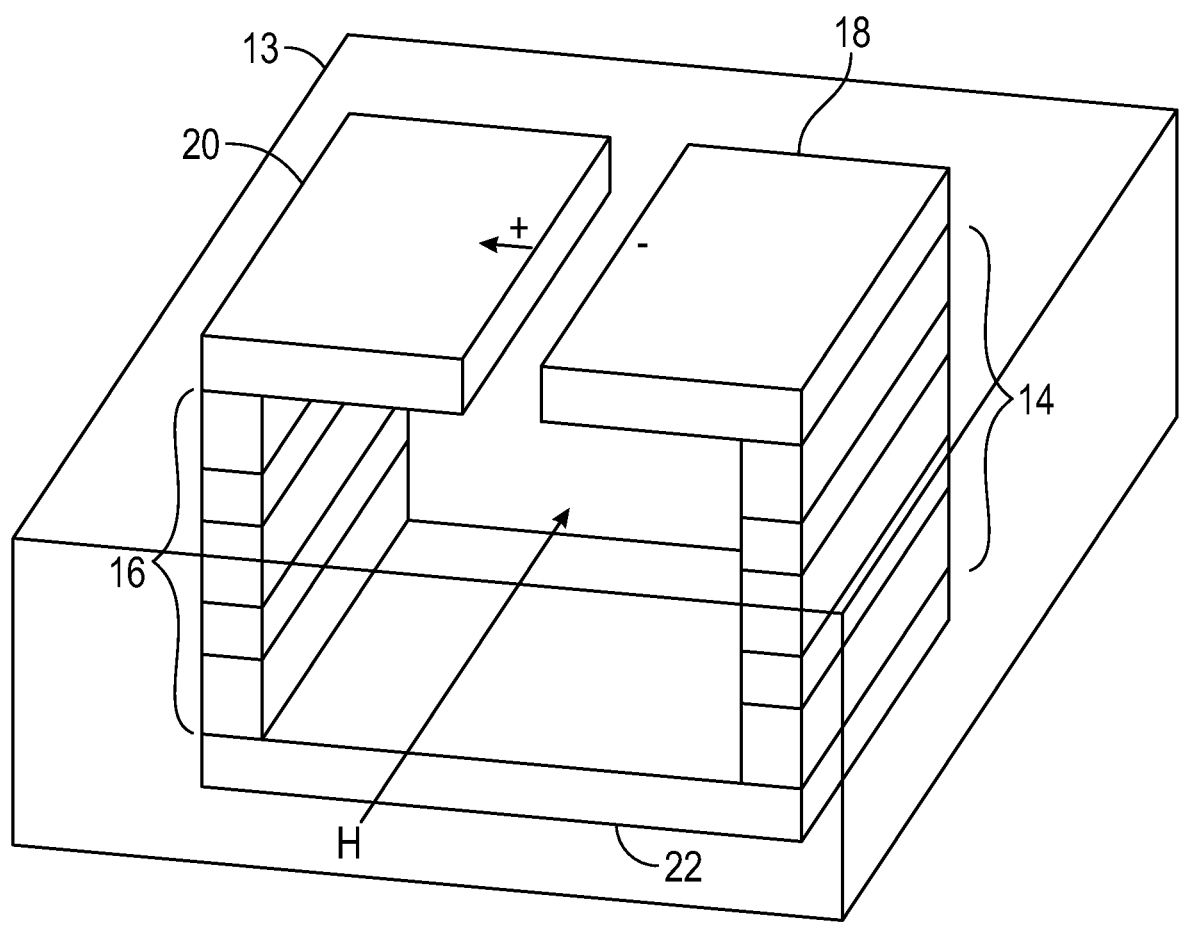
FIG. 2 illustrates a 3-D inductor of the present disclosure.

FIG. 2 demonstrates a first embodiment of a 3-D inductor created in a substrate 13 by stacking several layers of solid via bars to create solid via columns 14 and 16 that can be connected to terminal plates 18 and 20 on a top of the solid via columns 14 and 16 and a connector plate 22 on a bottom of the solid via columns 14 and 16. The substrate 13 may be any type of substrate made from suitable non-conductive material(s) and/or semiconductor material(s). Exemplary non-conductive materials include laminate, a semiconductor material, glass, a dielectric, plastic, fiberglass, and/or the like. Exemplary semiconductor materials include silicon (Si), silicon germanium (SiGe), gallium arsenide (GaAs), indium phosphide (InP), and/or the like. The substrate 13 may also be single-layered or multi-layered. Conductive structures (e.g., the 3-D inductor shown in FIG. 2, connection paths, transmission paths, contact pads, terminals, passive circuit elements, etc.) may be formed on and/or within the substrate 13.

The conductive structures may be metallic structures made from any type of metal(s) including, for example, copper (Cu), gold (Au), silver (Ag), nickel (Ni), metallic alloys, and/or the like. Conductive materials may also be non-metallic conductive materials (e.g., graphene). In this embodiment, the substrate 13 is a multi-layered substrate made from a laminate. The multi-layered substrate 13 thus includes a plurality of laminated substrate layers and metallic structures formed on and between the laminated substrate layers. The laminated substrate layers may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX- 70, CX-80, CX-90, CX-100, and/or the like. In this embodiment, the multi-layered substrate 13 includes standard tube vias.

While the specific embodiments described in this disclosure are implemented using a multi-layered substrate 13, the 3-D inductors described herein are not limited to multi-layered substrates. Alternatively, the 3-D inductors may be implemented using single-layered substrates.

With regard to the 3-D inductor shown in FIG. 2, the terminal plates 18 and 20 and the connector plate 22 are created in conductive layers of the multi-layered substrate 13. The solid via bars are created in non-conductive layers and provide a connection between the connective layers in the multi-layered substrate 13 to create the solid via columns 14 and 16. A magnetic field H of the 3-D inductor is parallel to the design plane of the multi-layered substrate 13, reducing the coupling factor of the 3-D inductor. A width of the solid via columns 14 and 16 can be increased to improve the metal density of the 3-D inductor to achieve a high quality (Q) factor without increasing the inductive resistance of the 3-D inductor of FIG. 2. However, the magnetic field H of the 3-D inductor of FIG. 2 is still open outside the 3-D inductor, limiting the proximity in which the 3-D inductor can be placed to other 3-D inductors.

Figure 3:
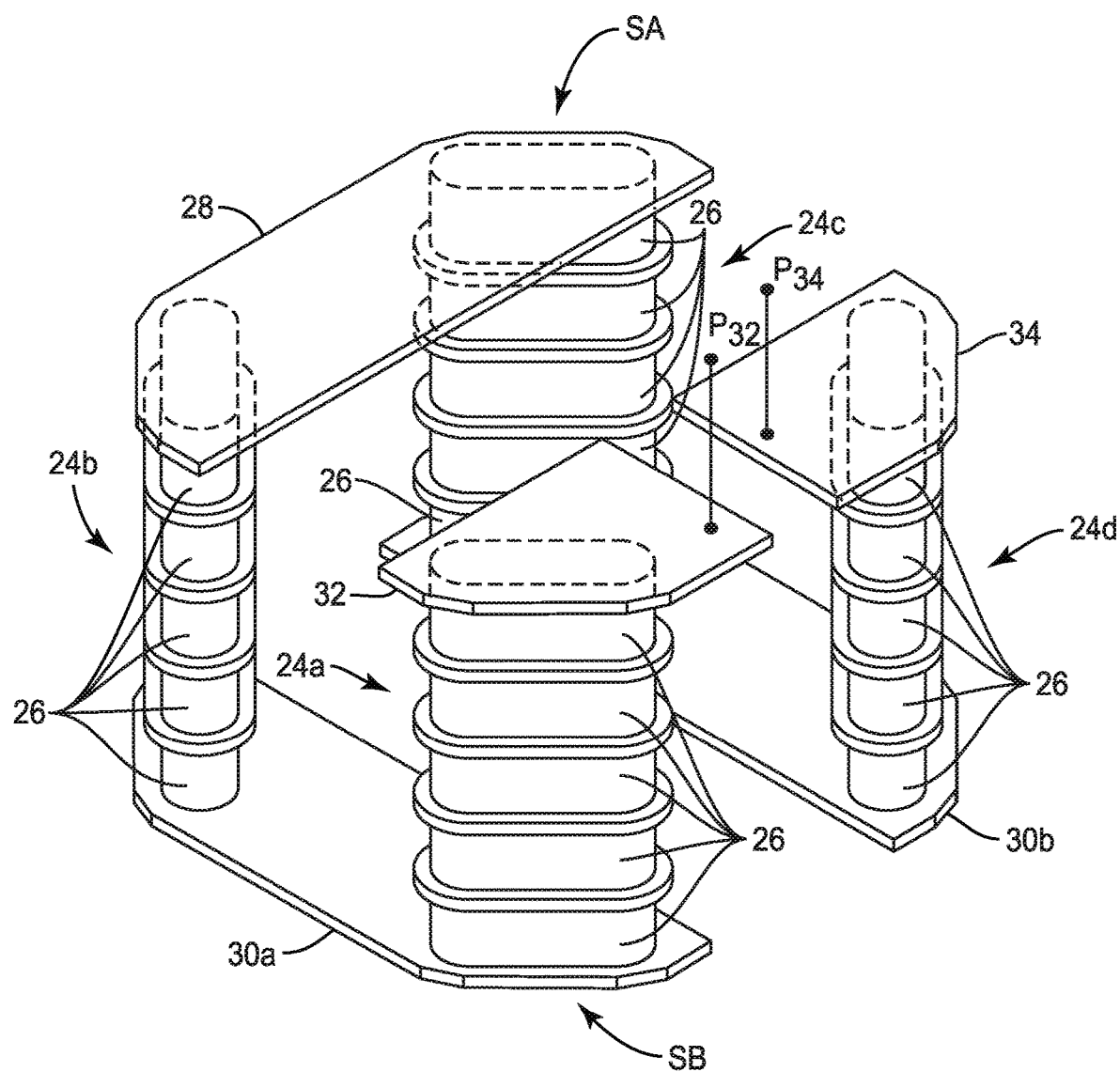
FIG. 3 illustrates a second embodiment of a 3-D inductor of the present disclosure.

A second embodiment of a 3-D inductor of the present disclosure is shown in FIG. 3. The 3-D inductor comprises four solid via columns (referred to generically as element 24, and specifically as solid via columns 24a, 24b, 24c, and 24d). Each of the solid via columns 24 is formed from a stack of solid via bars 26. The 3-D inductor of FIG. 3 also comprises three connector plates 28, 30a, and 30b. The connector plate 28 connects the solid via column 24b to the solid via column 24c on a first side SA of the 3-D inductor. On a second side SB of the 3-D inductor that is antipodal to the first side SA, the connector plate 30a connects the solid via column 24a to the solid via column 24b, and the connector plate 30b connects the solid via column 24c to the solid via column 24d. The 3-D inductor of FIG. 3 further comprises two terminal plates 32 and 34. The terminal plates 32 and 34 comprise a terminal connection for the 3-D inductor and are connected to the solid via columns 24a, 24d, respectively, at the first side SA. The terminal plates 32 and 34 can be connected to ports $P_{32}$ and $P_{34}$, respectively, for connection to an external component, such as, but not limited to, a tunable capacitor. Note that the 3-D inductor shown in FIG. 3 is also a three-dimensional inductor structure. Furthermore, while the 3-D inductor in FIG. 3 is cubic, other embodiments of the 3-D inductor may be any shape. For example, an alternative embodiment of the 3-D inductor may be spherical.

Current from the port $P_{32}$ flows to and across the terminal plate 32 down the solid via column 24a to the connector plate 30a. The current flow continues across the connector plate 30a up through the solid via column 24b to the connector plate 28. The current flow then continues across the connector plate 28 down through the solid via column 24c to the connector plate 30b. The current flow continues up through the solid via column 24d to the terminal plate 34 and up through the port $P_{34}$. Since the current direction of one solid via column 24 is parallel to an adjacent solid via column 24 (for example, the adjacent solid via columns 24a and 24b), the magnetic fields generated from each individual solid via column 24 cancel each other, thereby substantially confining the magnetic field to the interior of the 3-D inductor of FIG. 3. Thus, the 3-D inductor of FIG. 3 contains a small, or substantially zero, coupling factor. As such, the solid via columns 24a-24d, the connector plates 28, 30a, 30b, and the terminal plates 32, 34 are arranged such that the magnetic field generated by the 3-D inductor is substantially confined to the interior of the 3-D inductor. Substantially confining the magnetic field to the interior of the 3-D inductor is defined herein as keeping at least 85% of the magnetic field within the outer boundary of the 3-D inductor.

FIGS. 4A-4C provide cross-section views of the 3-D inductor of FIG. 3 in the multi-layered substrate 13. Note that the 3-D inductor shown in FIGS. 4A-4C is also a three-dimensional inductor structure. In particular, FIG. 4A provides a cross-section view of the terminal side of the 3-D inductor of FIG. 3. In FIG. 4A, the ports P32 and P34 extend from the surface of the multi-layered substrate 13 down to the respective terminal plates 32 and 34. Placing the 3-D inductor of FIG. 3 in the substrate 13 enables an active device, such as, but not limited to, a tunable capacitor, to be attached right above the 3-D inductor on the surface of the multi-layered substrate 13 to maintain a low series resistance between the 3-D inductor and the active device, and to ensure homogenous injection of current between the 3-D inductor and the active device. This arrangement also greatly reduces the amount of space resonant circuitry comprising the 3-D inductor of the present disclosure takes up in the multi-layered substrate 13.

FIG. 4A also provides a cross-section view of a gap 36 between the terminal plates 32 and 34. The gap 36 between the terminal plates 32 and 34 must be a minimum of approximately 50 microns to keep electrical separation between the terminal plates 32 and 34. It is also advantageous that the ports $P_{32}$ and $P_{34}$ are respectively connected to substantially the edge of the terminal plates 32 and 34 for proper current flow throughout the 3-D inductor of the present disclosure.

The cross-section view shown in FIG. 4A also demonstrates how a height h1 of the solid via bars 26 corresponds to a depth d1 of the substrate layers 37, which may range between approximately 50 microns and 80 microns. As shown, the height h1 of the solid via column 24a is dependent upon the depth d1 and the number of the solid via bars 26 available to create the solid via columns 24. For example, the height h1 of the solid via columns 24a-24d shown in FIGS. 4A-4C would be approximately 250 microns to 400 microns if the depth d1 ranges from approximately 50 microns to 80 microns. However, the height h1 of the solid via columns 24 of the present disclosure may be taller or shorter depending upon the number of solid via bars 26 used to construct the 3-D inductor and the depth d1 of each of those solid via bars 26. Each solid via bar 26 may be provided by a single core or a combination of a core that extends through a non-conductive layer of the substrate 13 and a portion of a conductive layer in the substrate 13. Each portion of the conductive layer of the solid via bars 26 is represented by the thin and wider portion on the top or bottom of each core.

The high Q factor and the small coupling factor of the 3-D inductor of FIG. 3 can be adjusted by either increasing or decreasing widths $w_1$ of the solid via columns 24a and 24b shown in FIG. 4B. The width $w_1$ of the solid via columns 24a and 24b can be increased to improve a metal density of the 3-D inductor and to achieve a high Q factor without increasing an inductive resistance of the 3-D inductor of FIG. 3. However, the width $w_1$ cannot be increased such that a spacing 38 between the solid via columns 24a and 24b is smaller than approximately 150 microns, which is the amount of space needed to provide an electrical separation between the solid via columns 24a and 24b.

A length $L_1$ of the connector plate 30a shown in FIG. 4B is dependent upon the width $w_1$ of the solid via columns 24a and 24b and the size of the spacing 38 to achieve a specific high Q value. Typically, a high Q value would be equal or higher than a value of 100, with an upper bound of 500, 750, or 1000, in different embodiments. For example, if the desired widths $w_1$ of the solid via columns 24a and 24b is approximately 400 microns, and the spacing 38 is approximately 400 microns, then the length $L_1$ of the connector plate 30a would be approximately 1200 microns. However, the width $w_1$, the spacing 38, and the length $L_1$ of the connector plate 30a may be larger or smaller, depending upon the desired Q factor and coupling factor of the 3-D inductor of the present disclosure.

In accordance with the 3-D inductor of FIG. 3 of the present disclosure, although not shown, the solid via columns 24c and 24d possess the same width $w_1$ of the solid via columns shown in FIG. 4B. A spacing between the solid via columns 24c and 24d also would be the same as the spacing 38 shown in FIG. 4B.

FIG. 4C shows the opposite terminal view of the 3-D inductor of FIG. 3 within the substrate 13. A length L2 of the connector plate 28 is also substantially long enough to connect the tops of the solid via columns 24b and 24c. In order to ensure that the path length the current travels is equal in each turn of the 3-D inductor of FIG. 3, the length L2 of the connector plate 28 is substantially equal to the length L1 of the connector plate 30a shown in FIG. 4B. For example, if the length L1 of the connector plate 30a of FIG. 4B is approximately 1200 microns, the length L2 of the connector plate 28 will also be approximately 1200 microns. In one embodiment, the terminal plates 32, 34, and the connector plates 28 and 30 are each approximately 20 microns.

Figure 5A:
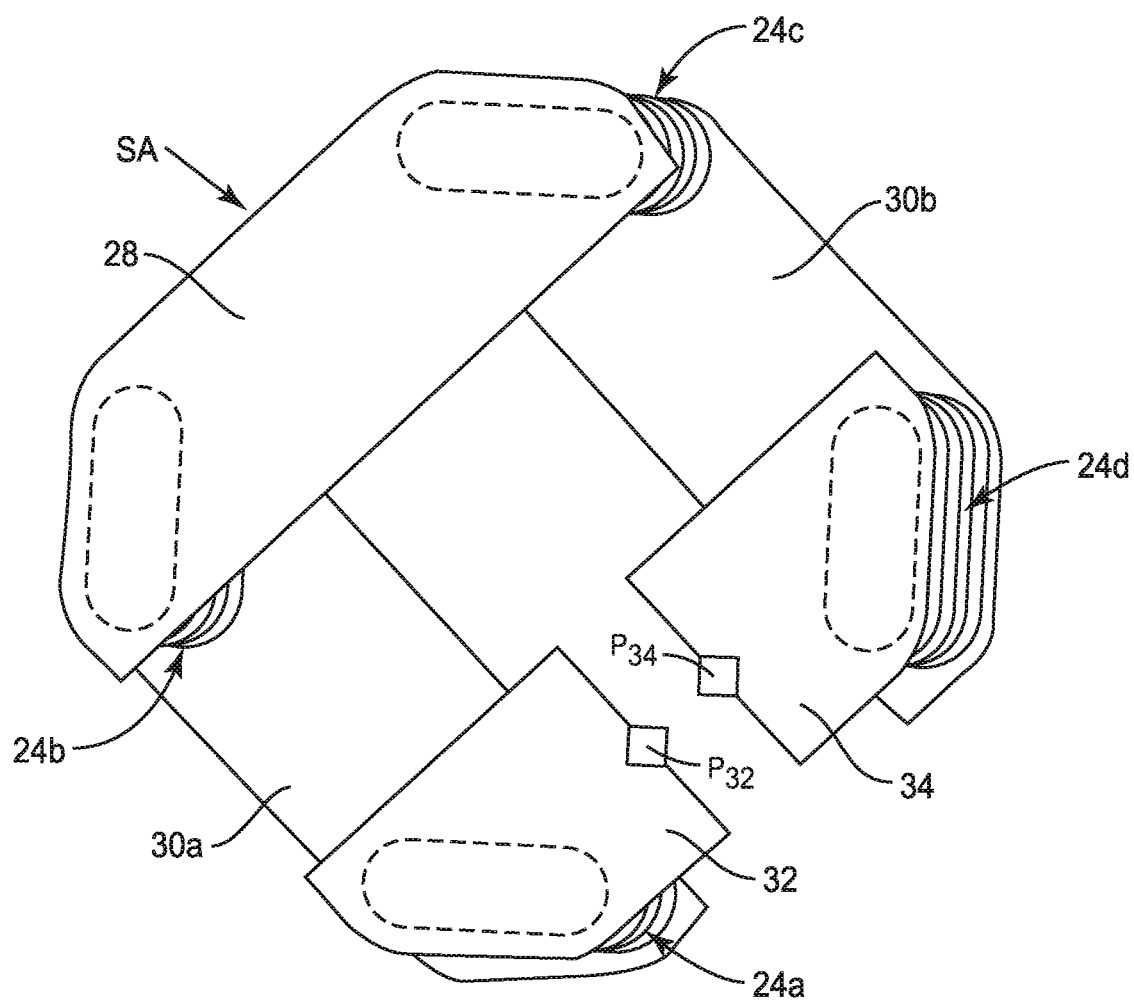
FIG. 5A illustrates a top-down view of the first embodiment of the 3-D inductor with a first embodiment of port connections to terminal plates of the 3-D inductor of the present disclosure.

FIG. 5A provides a top-down view of the 3-D inductor of FIG. 3 from the first side SA, and demonstrates the advantageous connection location for the ports $P_{32}$ and $P_{34}$. The advantageous placement of the port connections as shown in FIG. 5A enables the current flow in each of the solid via columns 24a-24d to have substantially equal magnitudes. Since the current flow of one solid via column 24a, 24b, 24c, 24d is equal in magnitude but in the opposite direction in comparison to the current flows of the adjacent solid via columns (24b, 24d), (24a, 24c), (24b, 24d), (24a, 24c) respectively, the magnetic fields from each of the individual solid via columns 24 cancel one another, confining the magnetic field to the interior of the 3-D inductor of FIG. 3. This enables the coupling factor of the 3-D inductor of FIG. 3 to be small or substantially zero.

Figure 5B:
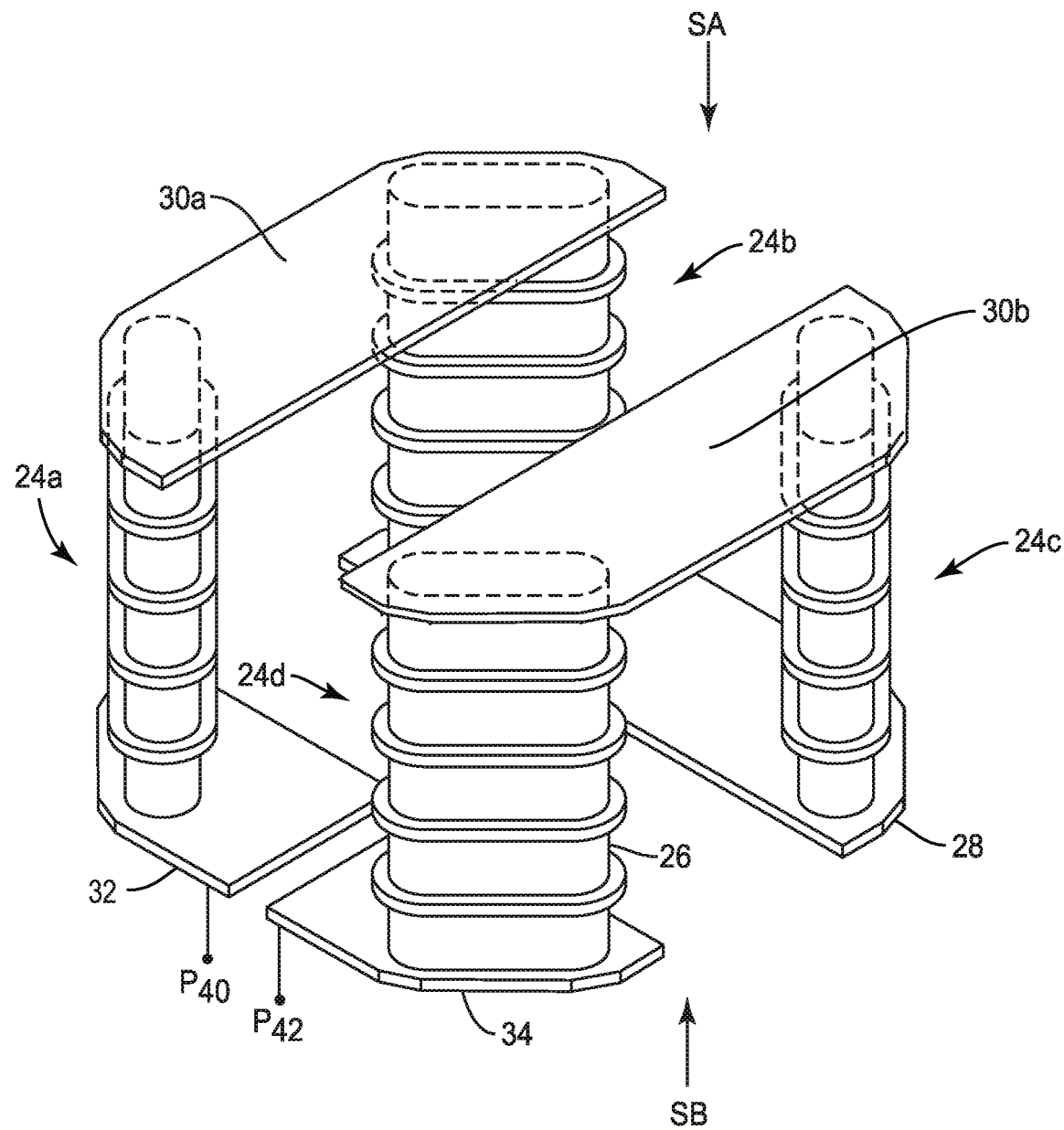
FIG. 5B illustrates a second embodiment of the 3-D inductor of the present disclosure with a second embodiment of the terminal plates of the present disclosure.

In another embodiment, FIG. 5B demonstrates an alternative placement for the terminal connection of the 3-D inductor of FIG. 3 in accordance with the present disclosure. Instead of placing the terminal connection on a top of the 3-D inductor of the present disclosure, a terminal connection comprising terminal plates 32 and 34 may be placed on the second side SB of the 3-D inductor as shown in FIG. 5B. An external component can connect to the bottom of the 3-D inductor of the present disclosure via ports $P_{40}$ and $P_{42}$. The ports $P_{40}$, $P_{42}$ may be terminals, other plates, nodes, solder bumps, and/or any other type of connecting component or location. The 3-D inductor of FIG. 5B is the same as the 3-D inductor of FIG. 5A, except that the 3-D inductor in FIG. 5B was formed to be oriented antipodally with respect to the first side SA and the second side SB. Thus, FIG. 5B demonstrates that the 3-D inductor can have any orientation. The 3-D inductor of the present disclosure may be used to create resonant circuitry, such as but not limited to tunable duplexers and bandpass filters. Note that the 3-D inductor shown in FIGS. 5A and 5B is also a three-dimensional inductor structure.

Figure 6:
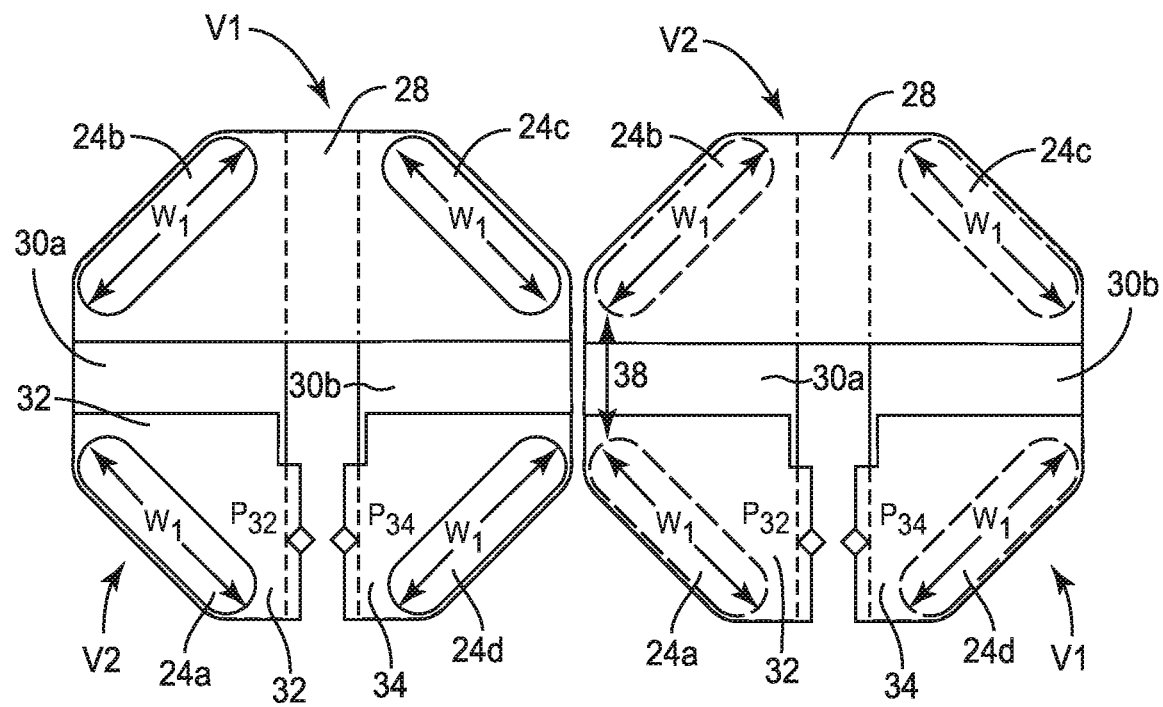
FIG. 6 illustrates two 3-D inductors placed in proximity to one another according to a first embodiment.

FIG. 6 illustrates embodiments of two 3-D inductors V1, V2, which are each the same as the 3-D inductor shown in FIGS. 3-5A. As shown, the 3-D inductors V1, V2 are placed in close proximity due to the small, or substantially zero, coupling factor of each of the 3-D inductors V1, V2. It should be appreciated by those skilled in the art that several 3-D inductors V1, V2 can be connected in series, and thus in close proximity, to create part of a resonant filter or resonant filter chain. The inductor structure V1 and the inductor structure V2 are thus arranged so as to generate a substantially confined magnetic field. In this example, the 3-D inductors V1, V2 of the present disclosure are symmetrical in that the widths $w_1$ of the solid via columns 24 of both of the 3-D inductors V1, V2 are equal and the spacing 38 between the solid via columns 24 of both of the 3-D inductors V1, V2 is such that a small or substantially zero coupling factor exists between the two 3-D inductors V1, V2. However, it may be desired to achieve a non-zero coupling factor between the two 3-D inductors V1, V2 of the present disclosure to achieve a particular function of a filter comprising 3-D inductors of the present disclosure, such as but not limited to filtering for a specific transfer function of a signal. Note that the 3-D inductors V1, V2 shown in FIG. 6 are three-dimensional inductor structures.

Figure 7:
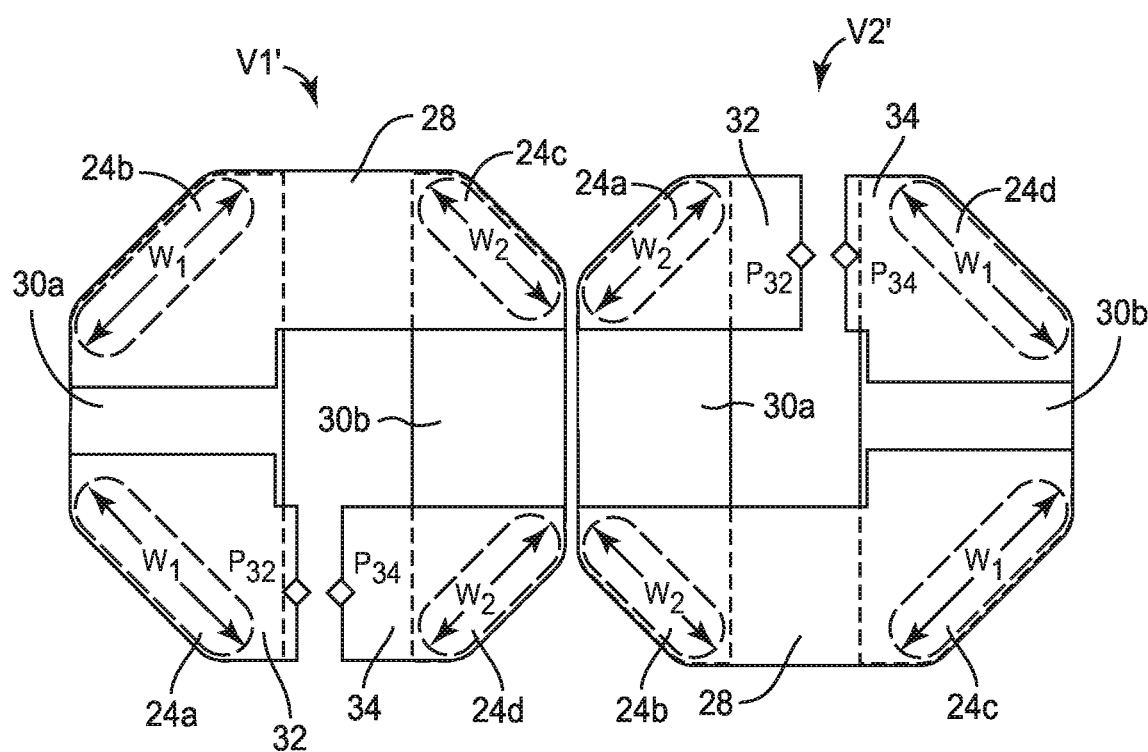
FIG. 7 illustrates two 3-D inductors placed in proximity to one another according to a second embodiment.

FIG. 7 illustrates embodiments of 3-D inductor V1' and V2', which are each the same as the 3-D inductor shown in FIGS. 3-5A. Note that the 3-D inductors V1', V2' shown in FIG. 7 are three-dimensional inductor structures. As in the 3-D inductors V1, V2 of FIG. 6, the solid via columns 24a, 24b of the 3-D inductor V1' and the solid via columns 24c, 24d of the 3-D inductor V2' each have widths $w_1$. However, unlike in the 3-D inductors V1, V2 of FIG. 6, the solid via columns 24c, 24d of the 3-D inductor V1' and the solid via columns 24a, 24b of the 3-D inductor V2' have width $w_2$. Thus, the solid via columns 24c, 24d of the 3-D inductor V1' that are adjacent to the solid via columns 24a, 24b of the 3-D inductor V2' are formed to have widths $w_2$. Accordingly, the solid via columns 24 of the 3-D inductor V1' have unequal widths $w_1$, $w_2$. Similarly, the solid via columns 24 of the 3-D inductor V2' have unequal widths $w_1$, $w_2$. The widths $w_2$ of adjacent solid via columns 24, as shown in FIG. 7, are smaller than the widths $w_1$. Increasing the spacing 38 by shrinking the widths $w_2$ controls leakage of the magnetic fields of the 3-D inductors V1', V2', and thus controls and achieves a non-zero coupling factor between the two 3-D inductors V1', V2'. The inductor structure V1' and the inductor structure V2' are arranged so as to generate a substantially confined magnetic field.

Figure 8:
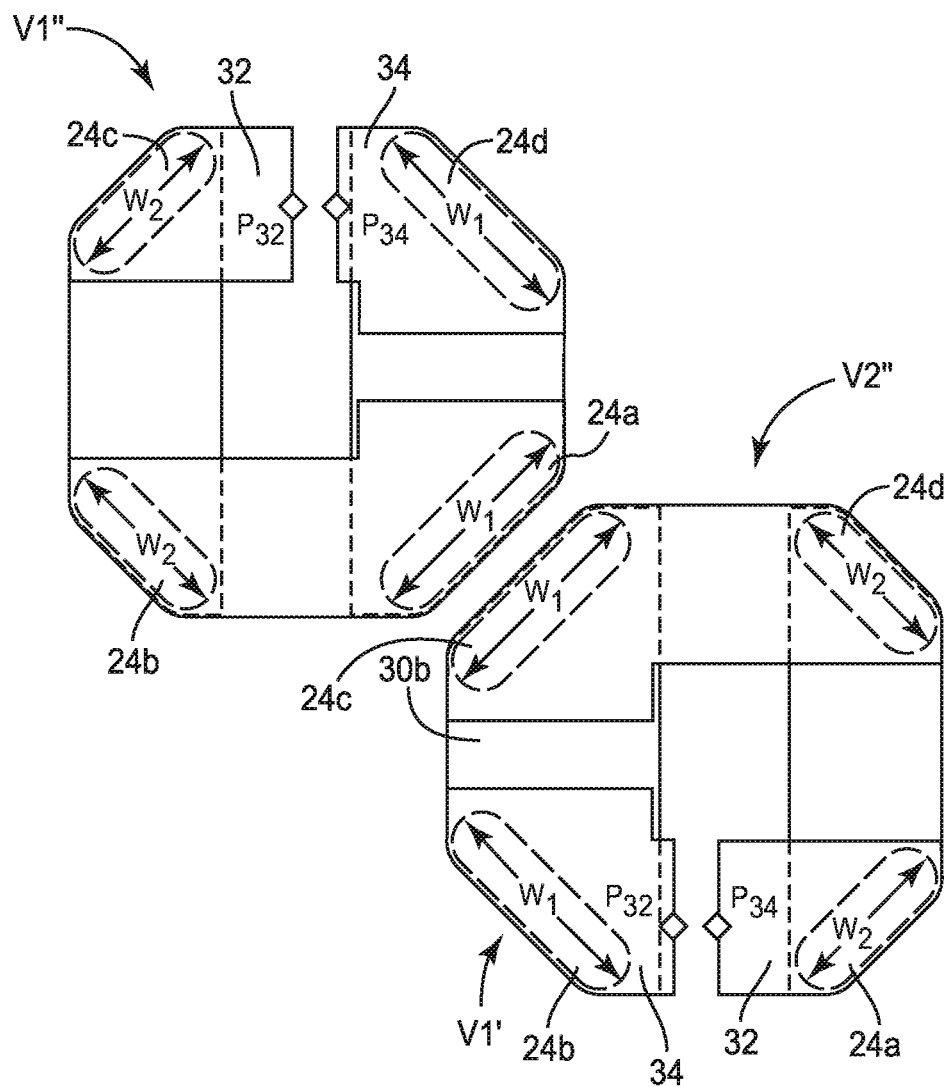
FIG. 8 illustrates two 3-D inductors placed in proximity to one another according to a third embodiment.
Figure 9:
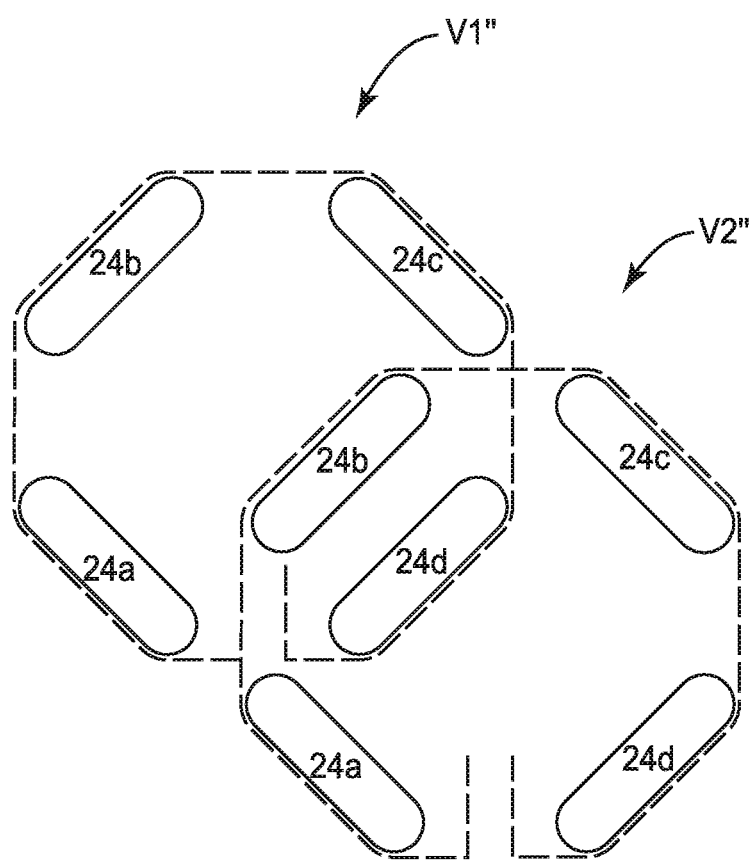
FIG. 9 illustrates two 3-D inductors overlapping one another according to a fourth embodiment.

FIGS. 8 and 9 illustrate two additional, but non-limiting, coupling configurations. For FIG. 8, 3-D inductors V1", V2" are placed diagonally to one another, such that the solid via column 24a of 3-D inductor V1" is aligned with and adjacent to solid via column 24c of 3-D inductor V2". FIG. 9 provides a variant where two 3-D inductors V1''', V2''' intertwine with one another such that the solid via column 24b of 3-D inductor V2''' resides substantially within the confines of 3-D inductor V1''', and the solid via column 24d of 3-D inductor V1''' resides substantially within the confines of 3-D inductor V2'''. The dashed lines represent the outer peripheries of the vertical inductors structures V1''', V2'''.

Resonant circuitry having the 3-D inductors V1, V2, V1', V2' in FIGS. 6 through 9 have high Q factors while utilizing much less space on a circuit board than traditional inductors, since the 3-D inductors V1, V2, V1', V2' can be placed in close proximity to one another. While only pairs of 3-D inductors $V1^X$, $V2^X$ are shown for these embodiments, any number of 3-D inductors $V1^X$, $V2^X$ may be coupled with one another.

Figure 10:
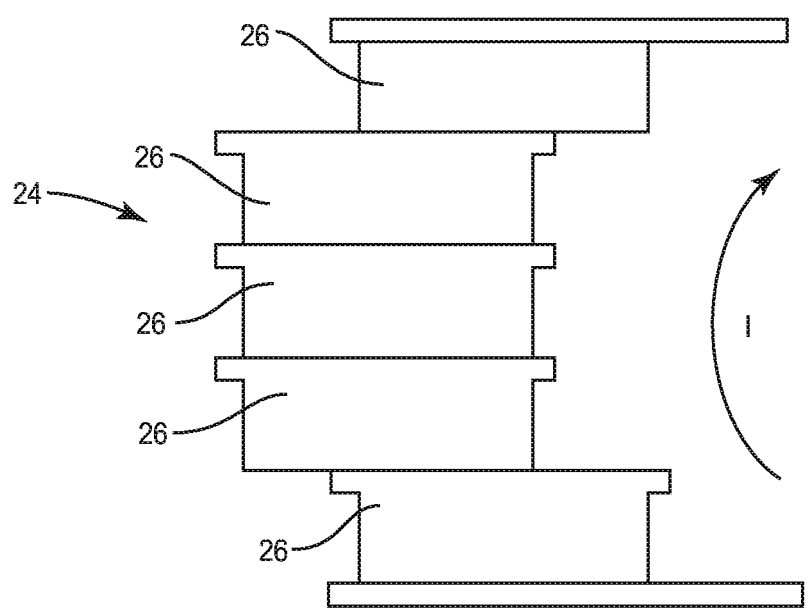
FIG. 10 illustrates an alternative embodiment to stacking solid via bars to create solid via columns of the present disclosure.

FIG. 10 illustrates an embodiment of one of the solid via columns 24. As shown, the solid via bars 26 of the solid via columns 24 of the present disclosure may be stacked in such a manner that a top solid via bar 26 and a bottom solid via bar 26 of a solid via column 24 are offset from the solid via bars 26 in the middle of the solid via column 24 to create a curved solid via column 24. A curvature I in the solid via column 24 may improve the current flow throughout the 3-D inductor and thus raise the Q factor of the 3-D inductors $V^X$ of the present disclosure. One or more of the solid via columns 24 shown in FIGS. 3-9 may be stacked in the same manner as the solid via columns 24 shown in FIG. 10.

Figure 11:
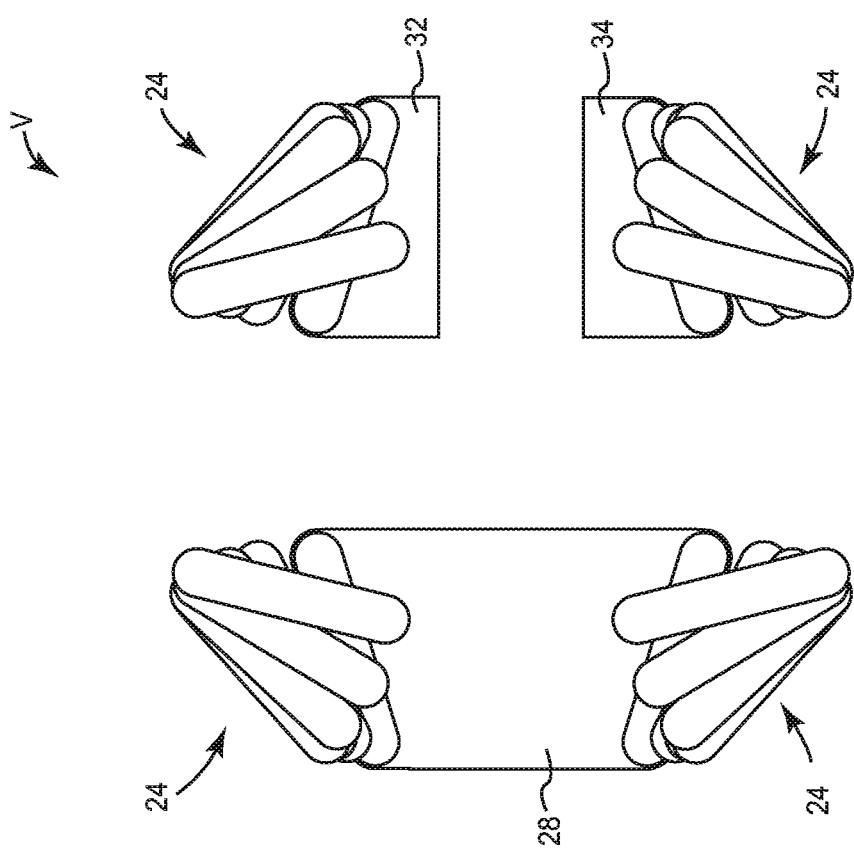
FIGS. 11 and 12 illustrate yet another embodiment of a 3-D inductor.
Figure 12:
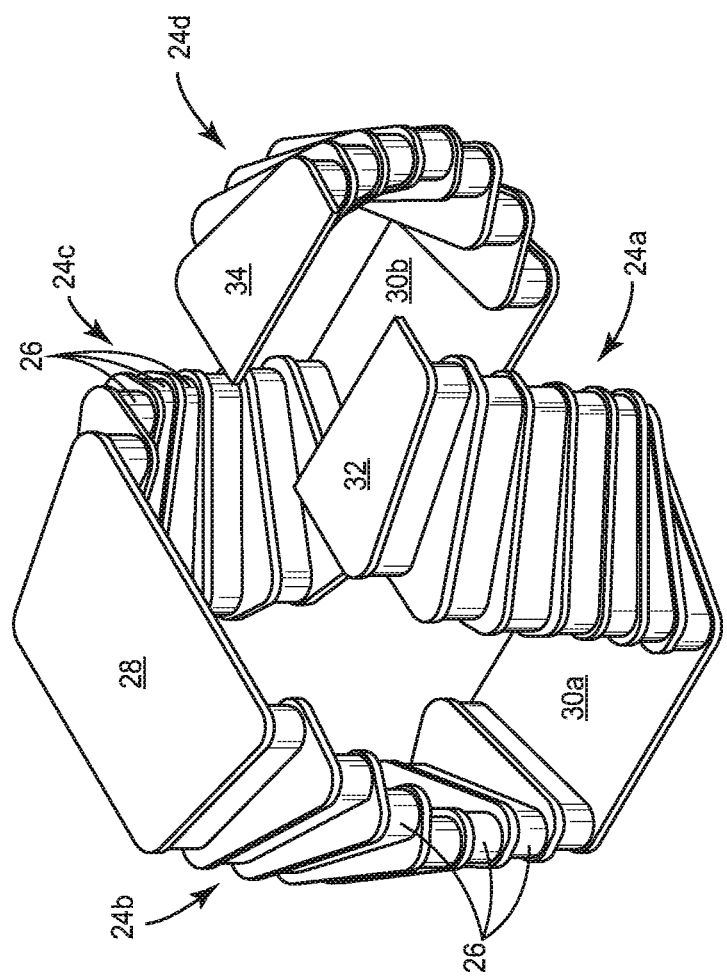

FIGS. 11 and 12 show a 3-D inductor V that incorporates solid via columns 24 that are each formed from successively shifted and rotated solid via bars 26. In this embodiment, the overall 3-D inductor V emulates an inductor structure that is "wrapped" around a substantially spherical form. Emulating a substantially spherical form for the 3-D inductor V tends to even further increase the Q of the 3-D inductor V by helping to distribute current flow across the conductive path provided by 3-D inductor V. At radio frequencies, current does not circulate in the entire volume of the conductive paths, but generally only at the surfaces. Therefore, the Q factor of the 3-D inductor V can be improved by maximizing the surfaces on which RF current travels.

Figure 13:
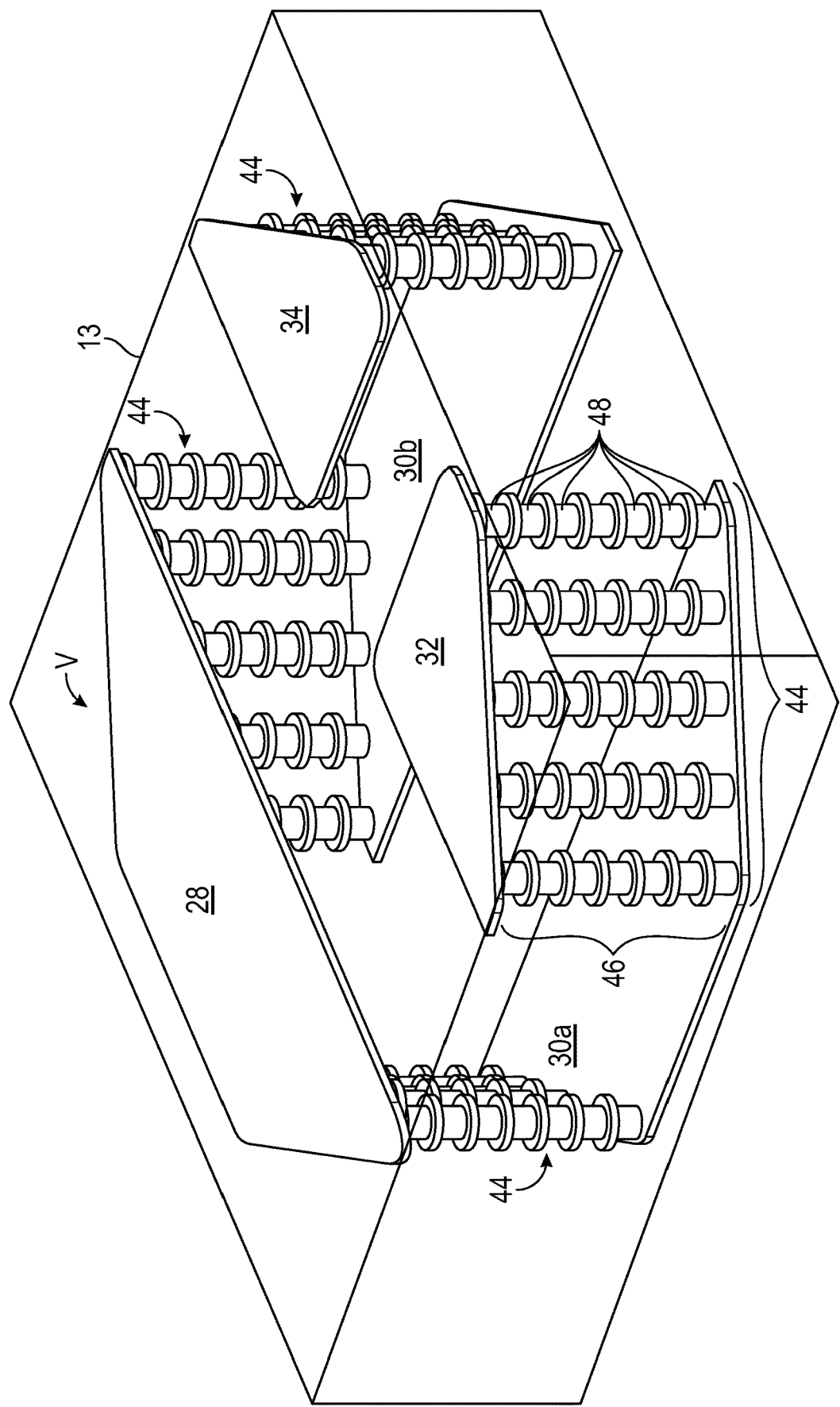
FIGS. 13 and 14 illustrates a first embodiment of a 3-D inductor that employs multi-via walls.
Figure 14:
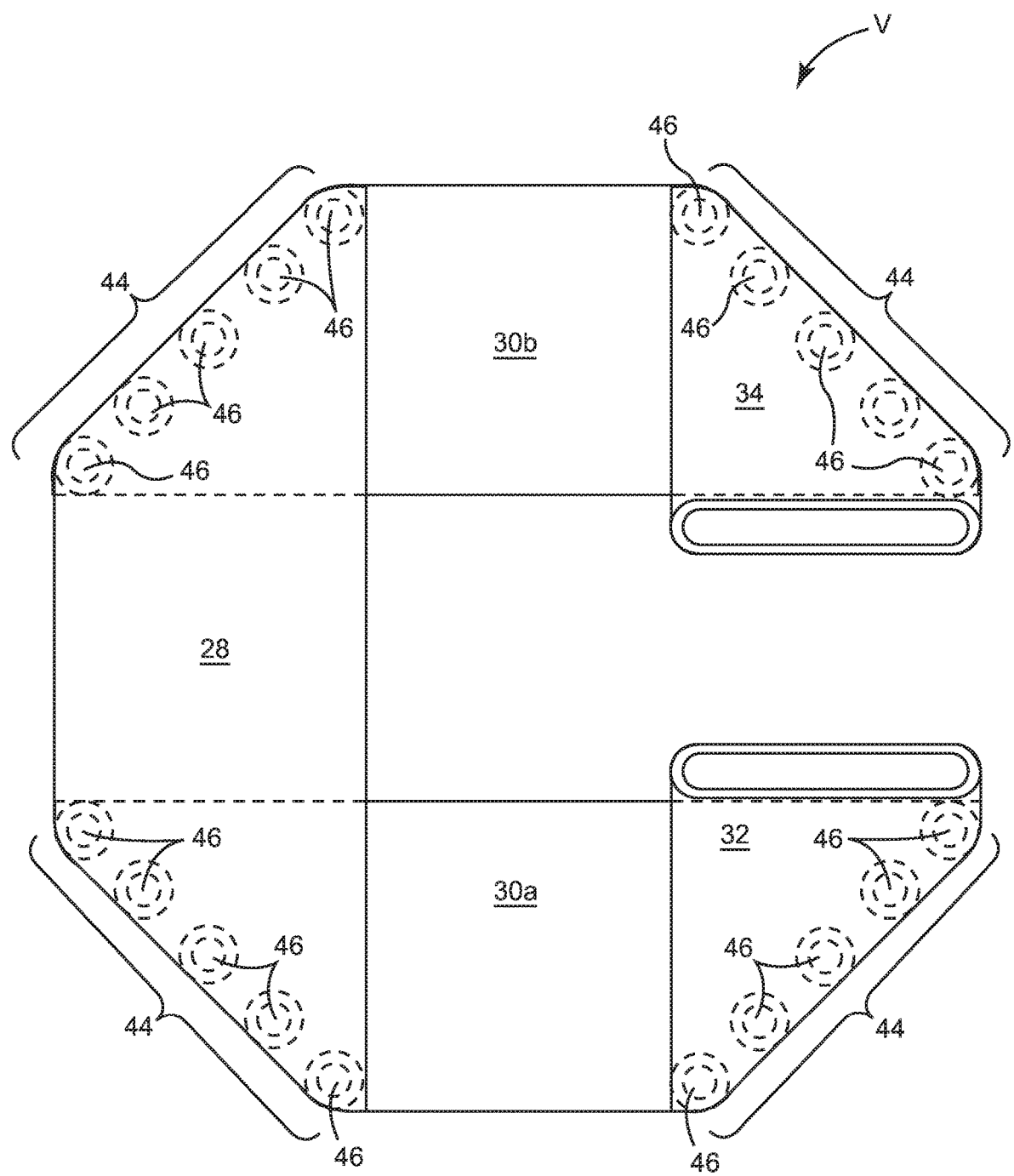

In FIGS. 13 and 14, an alternative embodiment of a 3-D inductor is illustrated wherein the solid via columns 24 are replaced with multi-via walls 44, which are comprised of at least two, and generally at least three, individual via columns 46. FIG. 13 is an isometric view of the 3-D inductor V, and FIG. 14 is a top view of the 3-D inductor V of FIG. 13. As illustrated, each multi-via wall 44 includes five individual via columns 46.

Each individual via column 46 includes at least two, and generally at least three, vias 48 that are stacked over one another such that at least a portion of adjacent vias 48 overlap one another. Like the solid via bars 26 in the prior embodiments, the vias 48 may include solid via portion and a portion of a metal layer at the top or bottom thereof. As illustrated, each individual via column 46 includes seven vias 48, which are aligned directly over top of one another. The multi-via walls 44 extend between the terminal plates 32, 34 and the connector plates 28, 30 in the same manner in which the solid via columns 24 extend between the terminal plates 32, 34, and the connector plates 28, 30 in the above embodiments. As with the embodiments of FIGS. 6, 7, and 8, the multi-via walls 44 of a 3-D inductor V may have the same or different widths, and the 3-D inductors V may be oriented next to each other to obtain varying degrees of coupling or to provide little or no coupling.

As a result, the 3-D inductor V provides a "metal band" through which current flows. The metal band is formed from the series connected terminal plate 32, the first multi-via wall 44, the connector plate 30a, the second multi-via wall 44, the connector plate 28, the third multi-via wall 44, the connector plate 30b, the second multi-via wall 44, and the terminal plate 34. In practice, the metal band actually provides multiple current paths due to the nature of current flowing through a conductor. In certain embodiments, the design goal is to design the 3-D inductor V to have multiple current paths of substantially equal length.

In the illustrated embodiment, current will flow horizontally through the entire width of the metal band and thus result in a much larger effective cross-section area for current flow. In the vertical direction, the current will flow through the different individual via columns 46 of the multi-via walls 44, which also results in a much larger effective cross-section area for current flow. The shape of the top or bottom "faces" of the 3-D inductor can be polygonal (as shown) or curved. The simplest shape that achieves the equal-current-path length is the equilateral octagon with equal 135-degree vertices angles (as shown). In this embodiment, opposing multi-via walls 44 directly face one another and are parallel with one another. Further, the width of each multi-via wall 44 is substantially equal to the distance between adjacent multi-via walls 44, wherein substantially equal is defined to be within +/−10% of a given width.

Figure 15:
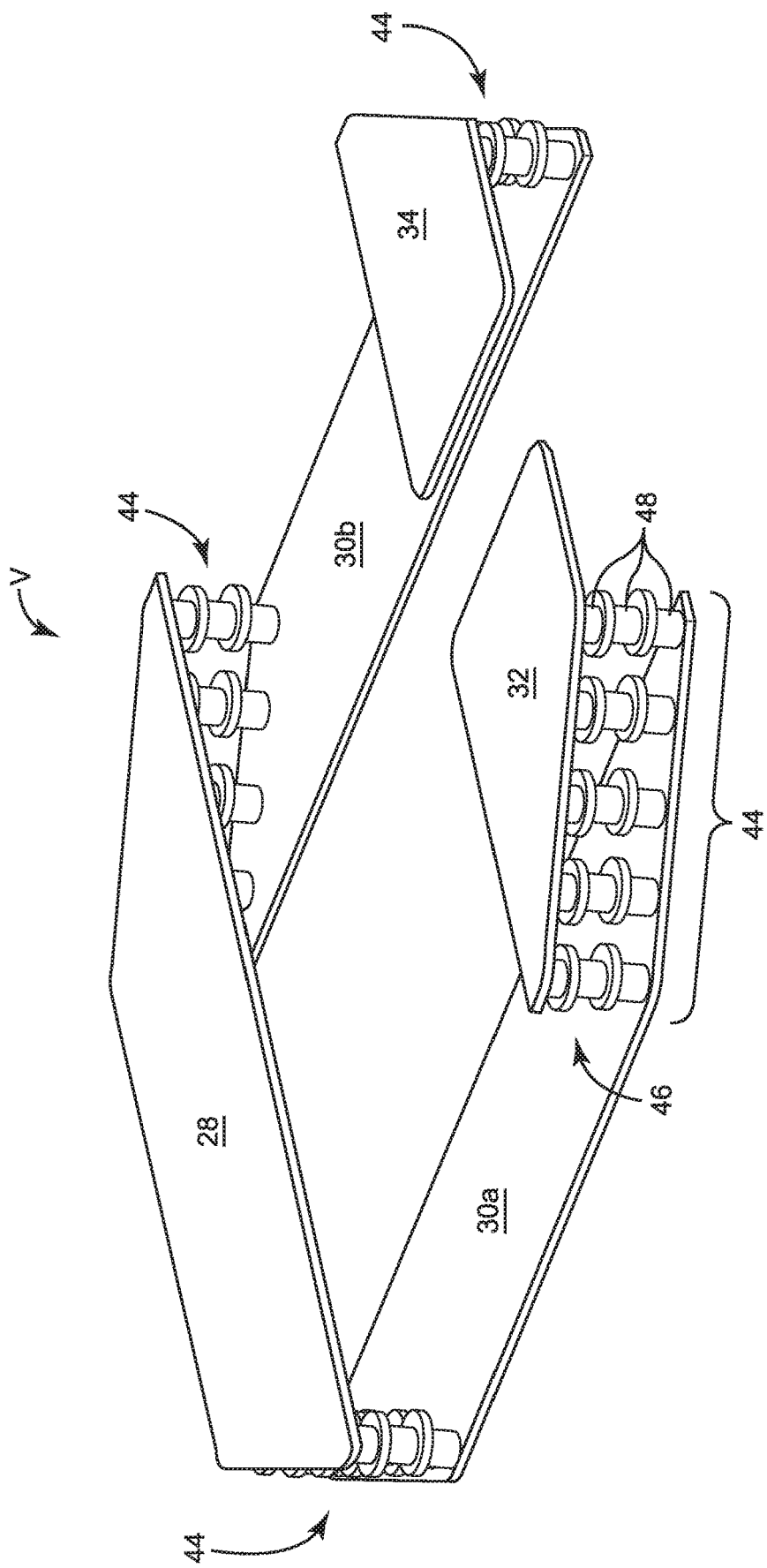
FIG. 15 illustrates a second embodiment of a 3-D inductor that employs multi-via walls.
Figure 16:
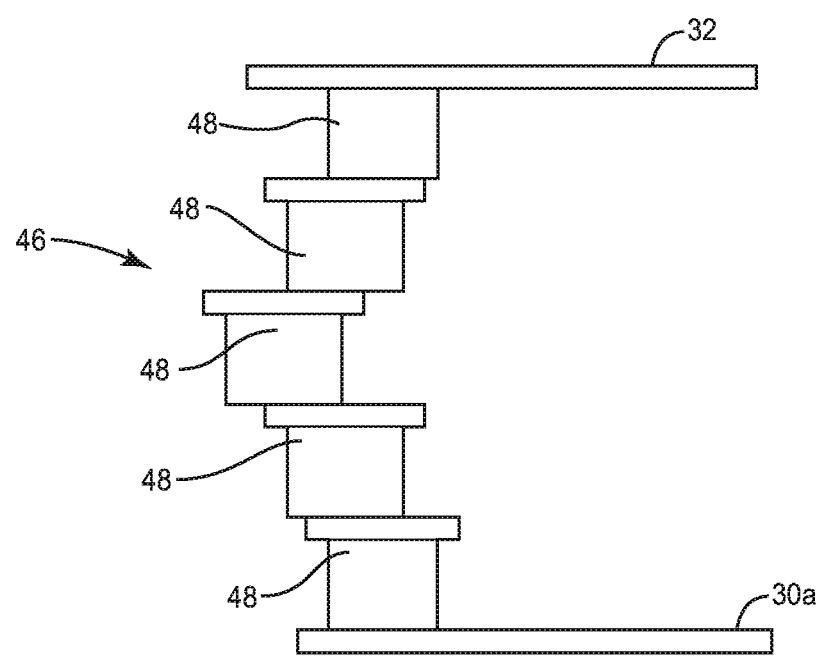
FIGS. 16 and 17 illustrate alternative embodiments to stacking individual via columns when multi-via walls are employed.
Figure 17:
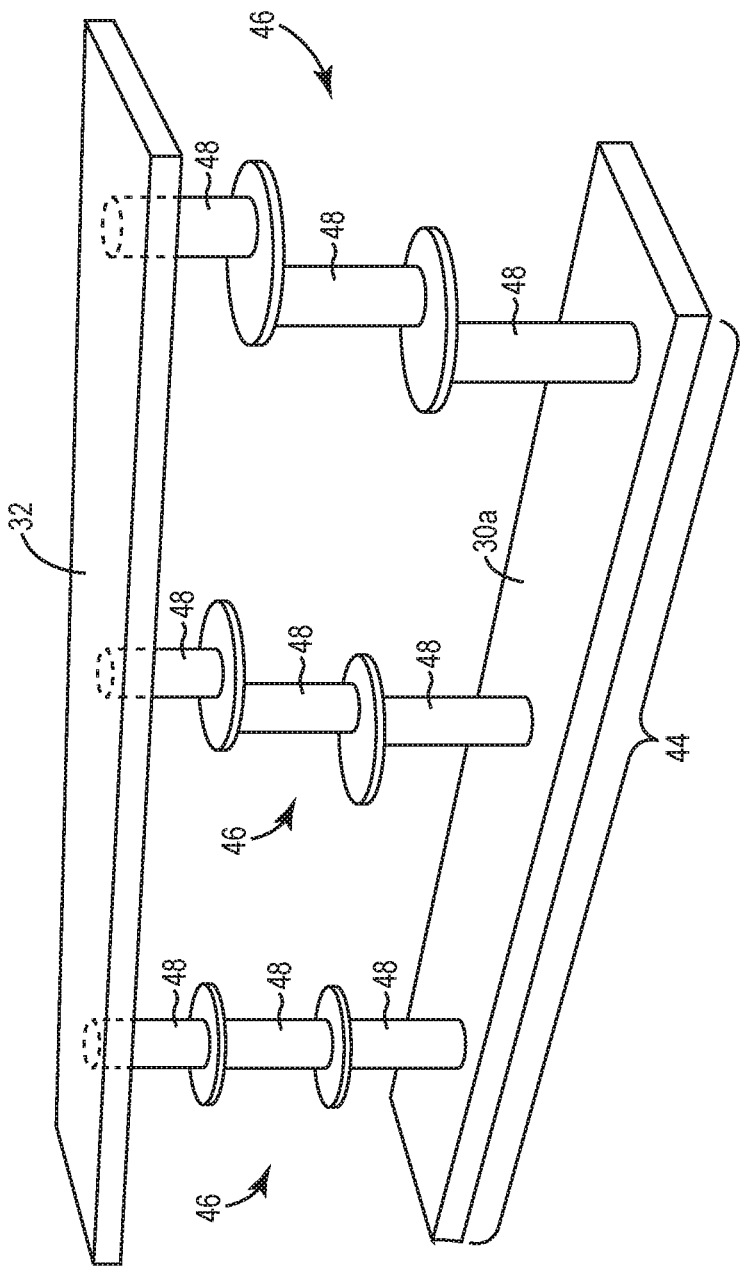

FIG. 15 illustrates an embodiment wherein each of the multi-via walls 44 includes five individual via columns 46, and each via individual via column 46 includes three vias 48. The resulting 3-D inductor V, when implemented in a laminated substrate, has a reduced vertical dimension relative to the embodiment of FIGS. 13 and 14. In each of these embodiments, the vias 48 are cylindrical with a circular cross section, and thus the individual via columns 46 are cylindrical. However, the vias 48 need not have a circular cross section. The cross sections may take various shapes including, but not limited to, square, rectangular, elliptical, and the like, which are symmetrical or asymmetrical. Further, the vias 48 need not be perfectly aligned over one another, as illustrated in FIG. 16, wherein the individual via columns 46 are curved to provide a non-linear path. The individual via columns 46 in a given multi-via wall 44 may also be aligned with each other in a linear (as shown) or non-linear fashion. FIG. 17 provides an embodiment wherein at least some of the individual via columns 46 within a given multi-via wall 44 have different shapes, which is helpful in implementing a wrapped embodiment such as that provided in FIGS. 11 and 12. In such an embodiment, the multi-via walls 44 effectively wrap around a virtual object, such a sphere, cube, or other three-dimensional structure with an interior in an effort to better distribute current flow through and raise the Q of the 3-D inductor V.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
 a multilayer substrate; and
 a three-dimensional (3-D) inductor formed in the multilayer substrate and comprising:
  a first connector plate, a second connector plate, a third connector plate, a first terminal plate, and a second terminal plate;
  a first multi-via wall formed in the substrate and from a first group of at least three individual via columns, each of which is separated from adjacent via columns and formed from a plurality of vias through layers of the multilayer substrate to connect the first terminal plate to the first connector plate;
  a second multi-via wall formed in the substrate and from a second group of at least three individual via columns, each of which is separated from adjacent via columns and formed from a plurality of vias through the layers of the multilayer substrate to connect the second terminal plate to the second connector plate;
  a third multi-via wall formed in the substrate and from a third group of at least three individual via columns, each of which is separated from adjacent via columns and formed from a plurality of vias through the layers of the multilayer substrate to connect the first connector plate to the third connector plate; and
  a fourth multi-via wall formed in the substrate and from a fourth group of at least three individual via columns, each of which is separated from adjacent via columns and formed from a plurality of vias through the layers of the multilayer substrate that connect the second connector plate to the third connector plate, wherein the first connector plate and the second connector plate are adjacent one another and a metal band is defined at least in part by the first multi-via wall, the first connector plate, the third multi-via wall, the third connector plate, the fourth multi-via wall, the second connector plate, and the second multi-via wall.

2. The apparatus of claim 1, wherein the first connector plate and the second connector plate are in parallel with one another and perpendicular to the third connector plate.

3. The apparatus of claim 1, wherein the plurality of vias that form the at least three via columns for each of the first, second, third, and fourth multi-via walls are stacked on top of one another.

4. The apparatus of claim 1, wherein the at least three via columns for each of the first, second, third, and fourth multi-via walls are linear and formed from the plurality of vias being stacked directly on top of one another.

5. The apparatus of claim 1, wherein at least one of the at least three via columns for each of the first, second, third, and fourth multi-via walls is linear and formed from the plurality of vias being stacked directly on top of one another.

6. The apparatus of claim 1, wherein at least one of the at least three via columns for each of the first, second, third, and fourth multi-via walls is non-linear and formed from the plurality of vias being stacked on top of one another with a partial overlap.

7. The apparatus of claim 1, wherein a value of a high Q factor of the 3-D inductor is greater or equal to 100.

8. The apparatus of claim 1, wherein a value of a high Q factor of the 3-D inductor is between 100 and 1000.

9. The apparatus of claim 1, wherein widths of each of the first multi-via wall, the second multi-via wall, the third multi-via wall, and the fourth multi-via wall are substantially equal.

10. The apparatus of claim 1, wherein the first connector plate, the first multi-via wall, the first terminal plate, the third multi-via wall, the third connector plate, the fourth multi-via wall, the second connector plate, the second multi-via wall, and the second terminal plate are connected to form a spherical structure having an interior.

11. The apparatus of claim 10 wherein a magnetic field caused by current flowing along the metal band is substantially confined to the interior.

12. The apparatus of claim 1, wherein the first connector plate, the first multi-via wall, the first terminal plate, the third multi-via wall, the third connector plate, the fourth multi-via wall, the second connector plate, the second multi-via wall, and the second terminal plate are connected to form a polygonal structure having an interior.

13. The apparatus of claim 12 wherein a magnetic field caused by current flowing along the metal band is substantially confined to the interior.

14. The apparatus of claim 1, wherein the first connector plate, the first multi-via wall, the first terminal plate, the third multi-via wall, the third connector plate, the fourth multi-via wall, the second connector plate, the second multi-via wall, and the second terminal plate are connected to form a three-dimensional structure that defines an interior.

15. The apparatus of claim 14, wherein a magnetic field caused by current flowing along the metal band is substantially confined to the interior.

16. The apparatus of claim 1, wherein each of the plurality of vias resides in a different layer of a plurality of substrate layers for each of the at least three via columns for each of the first, second, third, and fourth multi-via walls.

17. The apparatus of claim 16, wherein a value of a high Q factor of the 3-D inductor is between 100 and 1000.

18. The apparatus of claim 17, wherein the first connector plate, the first multi-via wall, the first terminal plate, the third multi-via wall, the third connector plate, the fourth multi-via wall, the second connector plate, the second multi-via wall, and the second terminal plate are connected to form a 3-D structure that defines an interior.

19. The apparatus of claim 18, wherein a magnetic field caused by current flowing along the metal band is substantially confined to the interior.

20. The apparatus of claim 18, wherein the first connector plate and the second connector plate are in parallel with one another and perpendicular to the third connector plate.

21. The apparatus of claim 20, wherein at least one of the at least three via columns for each of the first, second, third, and fourth multi-via walls is linear.

22. The apparatus of claim 1 wherein:
the 3-D inductor has a top face and an opposing bottom face defined by an outer periphery of the first connector plate, the first multi-via wall, the first terminal plate, the third multi-via wall, the third connector plate, the fourth multi-via wall, the second connector plate, the second multi-via wall, and the second terminal plate; and
the top face and the opposing bottom face define a polygon.

23. The apparatus of claim 22 wherein the polygon is an equilateral polygon.

24. The apparatus of claim 1 wherein the first multi-via wall is parallel with and opposes the fourth multi-via wall and the second multi-via wall is parallel with and opposes the third multi-via wall.

25. The apparatus of claim 1 wherein the first, second, third, and fourth multi-via walls are of a substantially equal width, and the first, second, third, and fourth multi-via walls are spaced apart from one another a distance that is substantially equal to the width.

26. The apparatus of claim 1 wherein:
each of the first group of at least three individual via columns in the first multi-via wall provides a separate current path between the first terminal plate and the first connector plate;
each of the second group of at least three individual via columns in the second multi-via wall provides a separate current path between the second terminal plate and the second connector plate;
each of the third group of at least three individual via columns in the third multi-via wall provides a separate current path between the first connector plate and the third connector plate; and
each of the fourth group of at least three individual via columns in the fourth multi-via wall provides a separate current path between the second connector plate and the third connector plate.

* * * * *